United States Patent
Osanai et al.

(10) Patent No.: US 9,076,500 B2
(45) Date of Patent: Jul. 7, 2015

(54) MEMORY MODULE INCLUDING PLURAL MEMORY DEVICES AND DATA REGISTER BUFFER

(71) Applicant: Elpida Memory, Inc., Tokyo (JP)

(72) Inventors: Fumiyuki Osanai, Tokyo (JP); Toshio Sugano, Tokyo (JP); Atsushi Hiraishi, Tokyo (JP)

(73) Assignee: PS4 LUXCO S.A.R.L., Luxembourg (LU)

( * ) Notice: Subject to any disclaimer, the term of this patent is extended or adjusted under 35 U.S.C. 154(b) by 128 days.

(21) Appl. No.: 13/685,192

(22) Filed: Nov. 26, 2012

(65) Prior Publication Data
US 2013/0135916 A1     May 30, 2013

(30) Foreign Application Priority Data
Nov. 28, 2011 (JP) ................. 2011-259470

(51) Int. Cl.
*G11C 5/04* (2006.01)
*G11C 7/10* (2006.01)
*G11C 11/4093* (2006.01)

(52) U.S. Cl.
CPC .............. *G11C 5/04* (2013.01); *G11C 7/1057* (2013.01); *G11C 7/1084* (2013.01); *G11C 11/4093* (2013.01)

(58) Field of Classification Search
CPC .... G11C 5/04; G11C 11/4093; G11C 7/1084; G11C 7/1057
USPC ........................................................ 365/51
See application file for complete search history.

(56) References Cited

U.S. PATENT DOCUMENTS

| 5,783,870 | A | 7/1998 | Mostafazadeh et al. |
| 7,562,271 | B2 * | 7/2009 | Shaeffer et al. ............ 714/724 |
| 7,894,231 | B2 * | 2/2011 | Kim et al. .................. 365/51 |
| 8,217,509 | B2 | 7/2012 | Horiuchi et al. |
| 8,437,164 | B1 * | 5/2013 | Law ........................... 365/63 |
| 2005/0018495 | A1 | 1/2005 | Bhakta et al. |
| 2008/0101105 | A1 | 5/2008 | Muff |
| 2009/0206470 | A1 | 8/2009 | Horiuchi et al. |
| 2010/0157645 | A1 | 6/2010 | Harashima et al. |
| 2010/0258933 | A1 | 10/2010 | Fujishima et al. |
| 2010/0261313 | A1 | 10/2010 | Toh et al. |
| 2010/0309706 | A1 | 12/2010 | Saito et al. |
| 2010/0312956 | A1 | 12/2010 | Hiraishi et al. |
| 2011/0244631 | A1 | 10/2011 | Horiuchi et al. |

FOREIGN PATENT DOCUMENTS

| JP | 2010-282510 | 12/2010 |
| TW | 200945461 | 11/2009 |

* cited by examiner

*Primary Examiner* — Hoai V Ho
*Assistant Examiner* — Tri Hoang

(57) ABSTRACT

Disclosed herein is a memory module that includes a module substrate, data connectors, memory devices, and data register buffers. A first main surface of the module substrate has first and second memory mounting areas. One of the first and second main surfaces of the module substrate has a register mounting area located between the first and second memory mounting areas in a planner view. The memory devices include a plurality of first memory devices that are mounted on the first memory mounting area and a plurality of second memory devices that are mounted on the second memory mounting area. The data register buffers are mounted on the register mounting area. The data register buffers transfers write data supplied from the data connectors to the memory devices, and transfers read data supplied from the memory devices to the data connectors.

17 Claims, 23 Drawing Sheets

MEMORY MODULE INCLUDING PLURAL MEMORY DEVICES AND DATA REGISTER BUFFER

BACKGROUND OF THE INVENTION

1. Field of the Invention

The present invention relates to a memory module, and more particularly to a memory module that includes a data register buffer for buffering read data read from memory devices and write data to be written to the memory devices.

2. Description of Related Art

Memory modules such as a dual inline memory module (DIMM) are configured so that a large number of memory chips such as dynamic random access memories (DRAMs) are mounted on a module substrate. Such a memory module is inserted into a memory slot arranged on a motherboard, whereby data transfer between the memory module and a memory controller is performed. Memory capacities that are required by the system have been extremely large in recent years, and it is difficult for a single memory module to provide a needed memory capacity. Most motherboards have a plurality of memory slots so that a plurality of memory modules can be mounted.

If a plurality of memory modules are mounted on the motherboard, the load capacitance of the data wiring on the motherboard increases to deteriorate signal quality. Such a problem is not significant when the data transfer rate between the memory controller and the memory modules is rather low. If the data transfer rate between the memory controller and the memory modules is high, a problem occurs because proper data transfer fails due to deterioration of signal quality.

Memory modules called load reduced memory modules are known to be capable of reducing the load capacitance of the data wiring (see Japanese Patent Application Laid-Open No. 2010-282510). The load reduced memory module described in Japanese Patent Application Laid-Open No. 2010-282510 includes a plurality of data register buffers. The data register buffers function to buffer write data supplied from a memory controller and supply the write data to a plurality of memory chips, and buffer read data supplied from a plurality of memory chips and supply the read data to the memory controller.

In the memory module described in Japanese Patent Application Laid-Open No. 2010-282510, the plurality of data register buffers are arranged near connectors. The wiring distances from the memory chips mounted on a memory mounting area closer to the connectors to the data register buffers are therefore different from those from the memory chips mounted on a memory mounting area farther from the connectors to the data register buffers. As a result, data skew occurs between the memory chips mounted on the memory mounting area closer to the connectors and the memory chips mounted on the memory mounting area farther from the connectors.

SUMMARY

In one embodiment, there is provided a memory module that includes: a module substrate having first and second main surfaces opposite to each other, the first main surface having first and second memory mounting areas, one of the first and second main surfaces having a register mounting area located between the first and second memory mounting areas in a planar view; a plurality of data connectors formed on the module substrate; a plurality of memory devices including a plurality of first memory devices that are mounted on the first memory mounting area and a plurality of second memory devices that are mounted on the second memory mounting area; and a plurality of data register buffers mounted on the register mounting area, the data register buffers transferring write data supplied from the data connectors to the memory devices, and transferring read data supplied from the memory devices to the data connectors.

In another embodiment, there is provided a memory module that includes: a module substrate; a data connector formed at one side of the memory module; a data register buffer mounted on the memory module and electrically connected to the data connector; first and second memory devices electrically connected in common to the data register buffer, the first and second memory devices being mounted on the memory module such that the data register buffer are arranged between the first and second memory devices.

DETAILED DESCRIPTION OF THE EMBODIMENTS

Preferred embodiments of the present invention will be explained below in detail with reference to the accompanying drawings.

Figure 1:
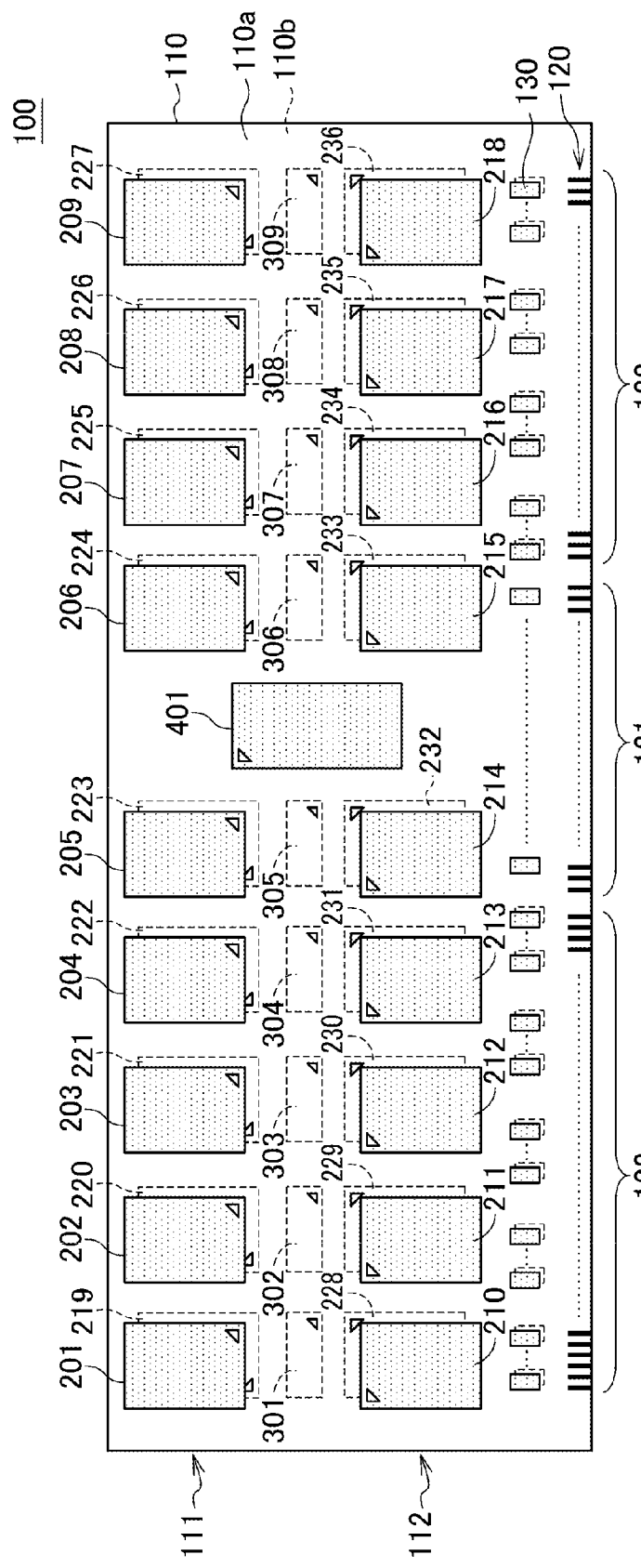
FIG. 1 is a schematic diagram showing the configuration of a memory module according to a first embodiment of the present invention.

Referring now to FIG. 1, the memory module 100 according to the first embodiment of the present invention includes a module substrate 110, and 36 memory chips 201 to 236, nine data register buffers 301 to 309, and a command address register buffer 401 which are mounted on the module substrate 110. As employed herein, the memory chips 201 to 236 may be referred to simply as "memory chips 200" if no distinction is needed. Similarly, the data register buffers 301 to 309 may be referred to simply as "data register buffers 300" if no distinction is needed.

The module substrate 110 is a printed circuit board having multilayer wiring. The module substrate 110 has a generally rectangular planar shape with a long side in the X direction shown in FIG. 1 and a short side in the Y direction. A plurality of connectors 120 are formed on one of the sides of the module substrate 110 along the X direction, the long side. The connectors 120 are terminals for establishing electrical connections with a memory controller through a memory slot to be described later. The connectors 120 are classified into command address connectors 121 to which a command address signal CA and a control signal CTRL are supplied from the memory controller, and data connectors 122 which are intended to supply read data to the memory controller or input write data from the memory controller. In the present embodiment, the number of pins of the data connectors 122 is, though not limited to, 72. Consequently, 72 bits of read data or write data can be simultaneously input or output.

The "command address signal CA" refers to a group of signals including an address signal ADD and a command signal CMD. The address signal ADD may include a bank address. The command signal CMD refers to a group of signals including a row address strobe signal RASB, a column address strobe signal CASB, and a write enable signal WEB.

The "control signal CTRL" refers to a group of signals including clock signals CK and CKB, chip select signals CS0B and CS1B, clock enable signals CKE0 and CKE1, and on-die termination signals ODT0 and ODT1. The clock signals CK and CKB are complementary signals. The chip select signals CS0B and CS1B and the clock enable signals CKE0 and CKE1 are signals for activating respective corresponding ranks (to be described later). The on-die termination signals ODT0 and ODT1 are signals for making respective corresponding ranks function as a termination resistor. As employed herein and in the drawings, if no distinction is needed, the clock signals CK and CKB may be referred to correctively as a clock signal CK. The chip select signals CS0B and CS1B may be referred to collectively as a chip select signal CSB. The clock enable signals CKE0 and CKE1 may be referred to collectively as a clock enable signal CKE. The on-die termination signals ODT0 and ODT1 may be referred to collectively as an on-die termination signal ODT. Such signals may be referred to collectively as a control signal CTRL.

Examples of the memory chips 201 to 236 are DRAMs. Of these, 18 memory chips 201 to 218 are mounted on one of the main surfaces 110a of the module substrate 110. The remaining 18 memory chips 219 to 236 are mounted on the other main surface 110b of the module substrate 110. The memory chips 201 to 218 and the memory chips 219 to 236 are mounted in respective opposite positions of the module substrate 110. When seen in a plan view, the memory chips 201 to 218 and the memory chips 219 to 236 are arranged in respective overlapping positions. For example, the memory chip 201 and the memory chip 219 are mounted on the front and back of the module substrate 110 in the same planar position, i.e., at the same X and Y coordinates. For ease of visualization, FIG. 1 shows each pair of memory chips 200 arranged on the front and back of the module substrate 110 in staggered planar positions. In fact, such memory chips 200 are in the same planar position as described above. As employed herein, "in a plan view" means being seen in a direction (Z direction) orthogonal to the X direction and the Y direction.

In FIG. 1, the triangular marks on the chips are orientation marks indicating the mounting directions of the chips. The same kind of chips with the orientation marks in the same positions are mounted in the same direction. Specifically, the memory chips 201 to 209 are mounted in the same directions. The memory chips 210 to 218 are mounted in the same direction. The memory chips 219 to 227 are mounted in the same direction. The memory chips 228 to 236 are mounted in the same direction. The memory chips 201 to 209 and the memory chips 210 to 218 are mounted in 180° different directions. The memory chips 219 to 227 and the memory chips 228 to 236 are mounted in 180° different directions. The memory chips 201 to 209 and the memory chip 219 to 227 lying on the front and back are mounted in the same directions. The memory chips 210 to 218 and the memory chips 228 to 236 lying on the front and back are mounted in the same directions. In the present invention, the memory chips 201 to 209 each may be referred to as a "first memory device." The memory chips 210 to 218 each may be referred to as a "second memory device." The memory chips 219 to 227 each may be referred to as a "third memory device." The memory chips 228 to 236 each may be referred to as a "fourth memory device." Note that the data register buffers 301 to 309 are mounted in the same direction.

The memory module 100 according to the present embodiment has a so-called two-rank configuration. A rank refers to a memory space to be exclusively selected. The same addresses are assigned to the ranks. Either one of the ranks is selected by exclusively activating the chip select signal CS0B or CS1B and exclusively activating the clock enable signal CKE0 or CKE1. In the present embodiment, the memory chips 201 to 218 mounted on the one main surface 110a of the module substrate 110 constitute rank0. The memory chips 219 to 236 mounted on the other main surface 110b of the module substrate 110 constitute rank1.

As shown in FIG. 1, the memory chips 201 to 236 are arranged in two rows on the module substrate 110 when seen in a plan view. More specifically, the memory chips 201 to 209 and 219 to 227 are arranged in a first row 111 which is farther from the connectors 120. The memory chips 210 to 218 and 228 to 236 are arranged in a second row 112 which is closer to the connectors 120. The memory chips 201 to 209 and 219 to 227 arranged in the first row 111 and the memory chips 210 to 218 and 228 to 236 arranged in the second row 112 have the same X coordinates, respectively. In other words, the memory chips are arranged in the Y direction when seen in a plan view. For example, the memory chips 201, 210, 219, and 228 have the same X coordinate. The same holds for the other corresponding memory chips.

The mounting positions of the memory chips 200 and the data register buffers 300 on the module substrate 110 will be explained in more detail with reference to FIGS. 2A and 2B.

Figure 2A:
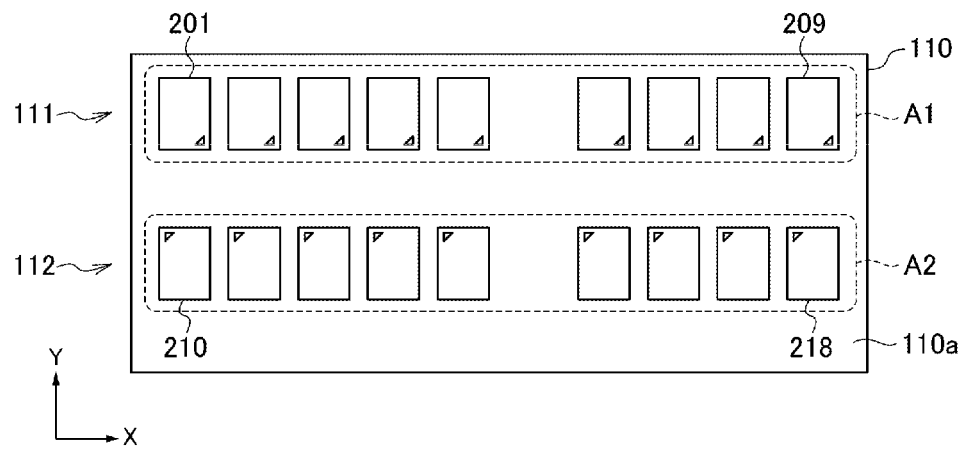
FIG. 2A shows the layout of the devices mounted on the one main surface of the module substrate according to the first embodiment.

As shown in FIG. 2A, the one main surface 110a of the module substrate 110 includes a first memory mounting area A1 and a second memory mounting area A2. The first memory mounting area A1 is defined in a portion corresponding to the first row 111. The second memory mounting area A2 is defined in a portion corresponding to the second row 112. The first memory mounting area A1 is the area where the memory chips 201 to 209 are arranged in the X direction. The second memory mounting area A2 is the area where the memory chips 210 to 218 are arranged in the X direction. As shown in FIG. 2B, the other main surface 110b of the module substrate 110 includes a third memory mounting area A3 and a fourth memory mounting area A4. The third memory mounting area A3 is defined in a portion corresponding to the first row 111. The fourth memory mounting area A4 is defined in a portion corresponding to the second row 112. The third memory mounting area A3 is the area where the memory chips 219 to 227 are arranged in the X direction. The fourth memory mounting area A4 is the area where the memory chips 228 to 236 are arranged in the X direction.

Of the memory chips 201 to 236 mounted on the memory mounting areas A1 to A4, four memory chips having the same X coordinate are connected in common to one of the data register buffers 300 that has the same X coordinate. For example, the memory chips 201, 210, 219, and 228 are connected in common to the data register buffer 301. The data register buffers 300 function to supply write data supplied from the corresponding data connectors 122 to the corresponding memory chips 200, and supply read data supplied from the corresponding memory chips 200 to the corresponding data connectors 122. For example, write data to be written to the memory chips 201, 210, 219, and 228 is buffered by the data register buffer 301. Read data read from the memory chips 201, 210, 219, and 228 is buffered by the register buffer 301.

Figure 2B:
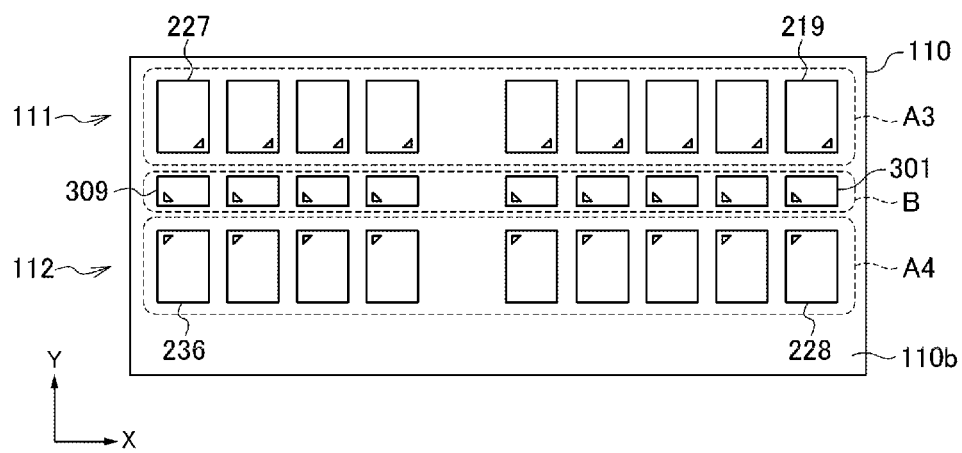
FIG. 2B shows the layout of the devices mounted on the other main surface of the module substrate according to the first embodiment.

As shown in FIG. 2B, the data register buffers 301 to 309 are arranged in the X direction in a register mounting area B which is sandwiched between the first row 111 and the second row 112 when seen in a plan view. In the present embodiment, the register mounting area B is defined on, though not limited to, the other main surface 110b of the module substrate 110. In other words, the register mounting area B is sandwiched between the third and fourth memory mounting areas A3 and A4. In a transparent view, the register mounting area B is sandwiched between the first and second memory mounting areas A1 and A2.

The structure of an information processing system 10 that includes the memory module 100 will be explained with reference to FIG. 3.

Figure 3:
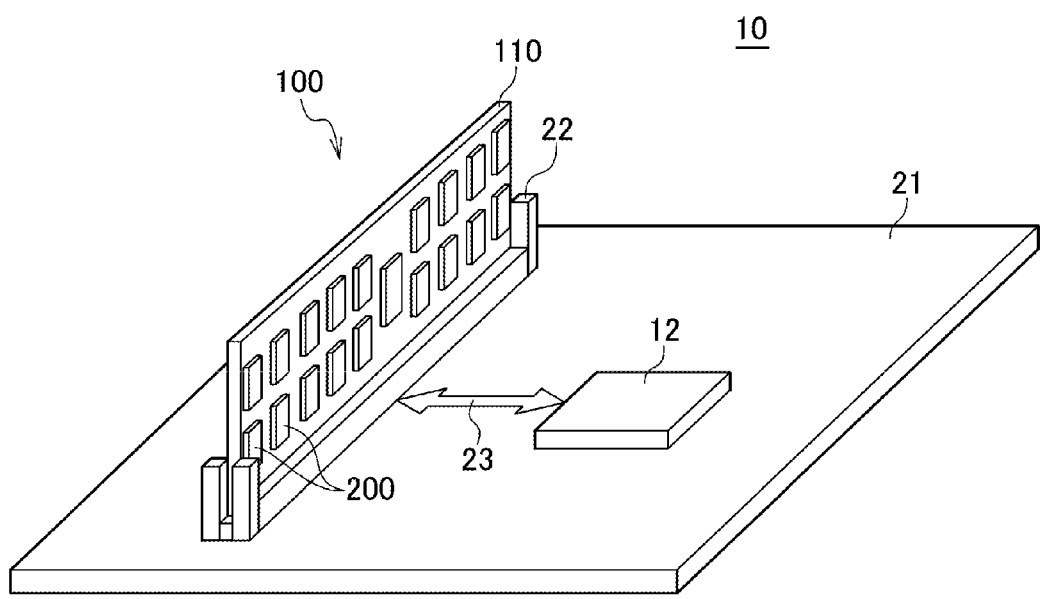
FIG. 3 is a perspective view schematically showing the structure of an information processing system which includes the memory module shown in FIG. 1.

As shown in FIG. 3, the information processing system 10 is constructed on a motherboard 21. The motherboard 21 includes a memory slot 22. The memory module 100 according to the present embodiment is inserted into the memory slot 22. A memory controller 12 is mounted on the motherboard 21. The memory controller 12 is connected to the memory module 100 through wiring 23 formed on the motherboard 21. Note that the memory controller 12 is not directly connected to the memory chips 200 on the memory module 100, but connected to the memory chips 200 through the data register buffers 301 to 309 and the command address register buffer 401. Such a connection reduces the load capacitance of the signal path connecting the memory controller 12 and the memory module 100, whereby favorable signal quality can be provided even at a high data transfer rate.

While the information processing system 10 shown in FIG. 3 has only one memory slot 22 on the motherboard 21, actual memory systems may include a plurality (for example, four) of memory slots. The memory module 100 is mounted on each of the memory slots. If a plurality of memory modules 100 are mounted, the load capacitance of the signal path increases accordingly. In the present embodiment, the load capacitance per memory module is extremely small as compared to heretofore, and fast data transfer is possible even when a plurality of memory modules are mounted.

Next, the configuration of the memory chips 200 will be described.

Figure 4:
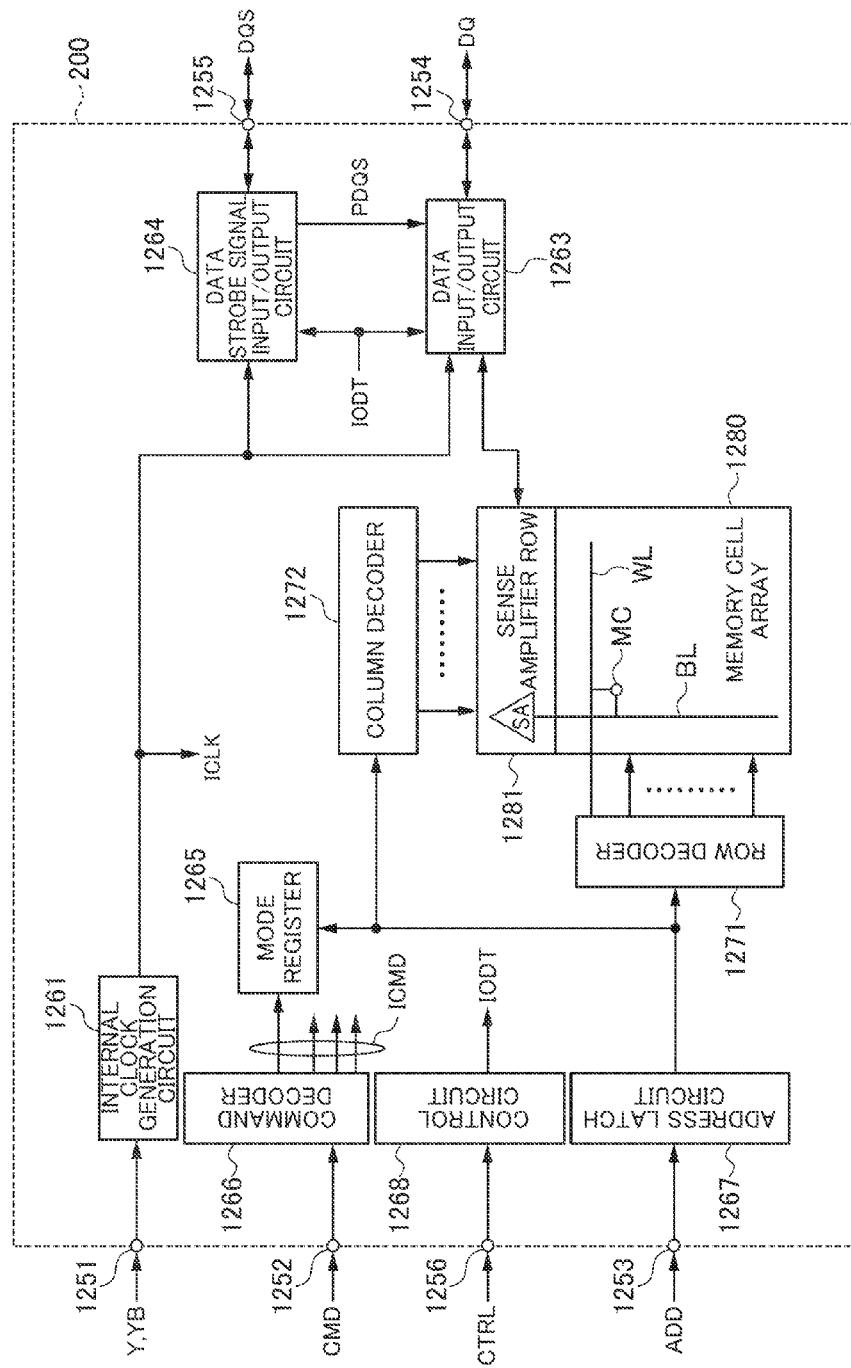
FIG. 4 is a block diagram showing the configuration of a memory chip included in memory module according to the first embodiment.

The memory chip 200 is a DRAM. As shown in FIG. 4, the memory chip 200 has a clock terminal 1251, a command terminal 1252, a control terminal 1256, an address terminal 1253, a data input/output terminal 1254, and a data strobe terminal 1255 as external terminals. Of these, the clock terminal 1251, the command terminal 1252, the control terminal 1256, and the address terminal 1253 are connected to the command address register buffer 401. The data input/output terminal 1254 and the data strobe terminal 1255 are connected to a corresponding data register buffer 300. The memory chip 200 also includes other terminals such as a power supply terminal, which are omitted from the diagram.

The clock terminal 1251 is a terminal to which complementary clock signals Y and YB are supplied. The supplied clock signals Y and YB are supplied to an internal clock generation circuit 1261. The internal clock generation circuit 1261 generates an internal clock signal ICLK based on the clock signals Y and YB, and supplies the generated internal clock signal ICLK to various circuit blocks including a data input/output circuit 1263 and a data strobe signal input/output circuit 1264. In the present embodiment, the memory chip 200 includes, though not limited, no DLL circuit.

The command terminal 1252 is a terminal to which the command signal CMD including the row address strobe signal (RASB), the column address strobe signal (CASB), and the write enable signal (WEB) is supplied. The command signal CMD is supplied to a command decoder 1266. The command decoder 1266 retains, decodes, and counts the command signal in synchronization with the internal clock ICLK to generate various internal commands ICMD. The generated internal commands ICMD are supplied to various circuit blocks including a mode register 1265.

The control terminal 1256 is a terminal to which a rank-specific control signal CTRL including a chip select signal (CSB), a clock enable signal (CKE), and an on-die termination signal (ODT) is supplied. The control signal CTRL is supplied to a control circuit 1268. The control circuit 1268 generates internal control signals such as an internal on-die termination signal IODT based on the control signal CTRL.

The address terminal 1253 is a terminal to which the address signal ADD is supplied. The supplied address signal ADD is supplied to an address latch circuit 1267. The address latch circuit 1267 latches the address signal ADD in synchronization with the internal clock signal ICLK. Of the address signal ADD latched in the address latch circuit 1267, a row address is supplied to a row decoder 1271 and a column address is supplied to a column decoder 1272. When in mode register setting, the address signal ADD is supplied to the mode register 1265, whereby the content of the mode register 1265 is updated.

The row decoder 1271 is a circuit that selects any one of word lines WL included in a memory cell array 1280. The memory cell array 1280 includes a plurality of word lines WL and a plurality of bit lines BL which intersect each other. Memory cells MC are arranged at the intersections (FIG. 4 shows only one of the word lines WL, one of the bit lines BL, and one of the memory cells MC). The bit lines BL are connected to sense amplifiers SA included in a sense amplifier row 1281. The sense amplifiers SA are selected by the column decoder 1272.

The selected sense amplifiers SA are connected to the data input/output circuit 1263. The internal clock signal ICLK and an internal data strobe signal PDQS are supplied to the data input/output circuit 1263. In a read operation, the data input/output circuit 1263 outputs read data in synchronization with the internal clock signal ICLK. In a write operation, the data input/output circuit 1263 takes in write data in synchronization with the internal data strobe signal PDQS. As a result, in a read operation, the read data read from the memory cell array 1280 is output from the data input/output terminal 1254. In a write operation, the write data received from the data input/output terminal 1254 is written to the memory cell array 1280.

The data strobe terminal 1255 is a terminal for inputting and outputting a data strobe signal DQS. The data strobe terminal 1255 is connected to the data strobe signal input/output circuit 1264. The data strobe signal input/output circuit 1264 generates the foregoing internal data strobe signal PDQS, and supplies the internal data strobe signal PDQS to the data input/output circuit 1263.

The internal on-die termination signal IODT, an output of the control circuit 1268, is also supplied to the data input/output circuit 1263 and the data strobe signal input/output circuit 1264. If the internal on-die termination signal IODT is activated, both the data input/output circuit 1263 and the data strobe signal input/output circuit 1264 function as a termination resistor.

Figure 5:
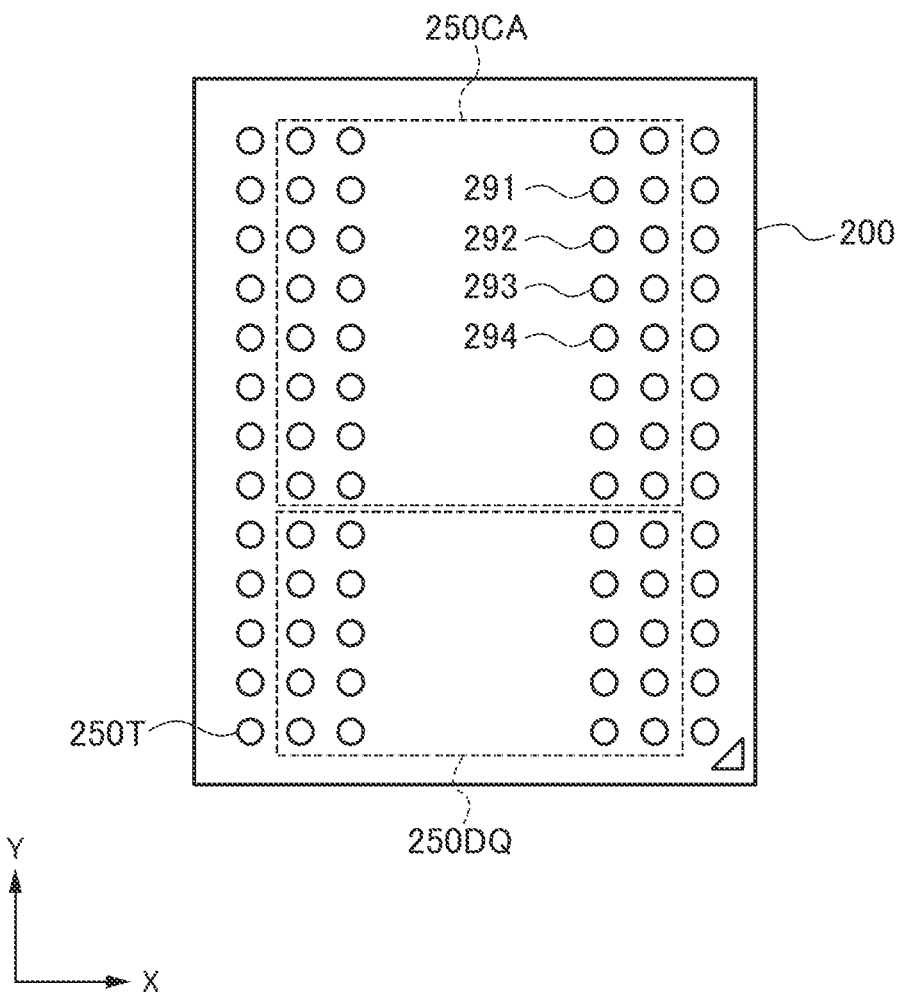
FIG. 5 is a schematic plan view for describing the arrangement of external terminals formed on the memory chip shown in FIG. 4.

As shown in FIG. 5, the memory chip 200 includes a plurality of external terminals 250T which are laid out in a matrix configuration. In FIG. 5, the area designated by the reference number 250DQ is an area where data-system external terminals, or more specifically, the data input/output terminal 1254 and the data strobe terminal 1255 shown in FIG. 4 are arranged. The area designated by the reference number 250CA in FIG. 5 is an area where command/address-system external terminals and control-system external terminals, or more specifically, the clock terminal 1251, the command terminal 1252, the control terminal 1256, and the address terminal 1253 shown in FIG. 4 are arranged. The area 250DQ and the area 250CA are arranged in the Y direction. The area 250DQ lies closer to the orientation mark. The Y direction corresponds to the direction of the short side of the module substrate 110 as shown in FIG. 1.

The overall configuration of the memory chip 200 has been described above. Next, the configuration of the data register buffers 300 will be described.

Figure 6:
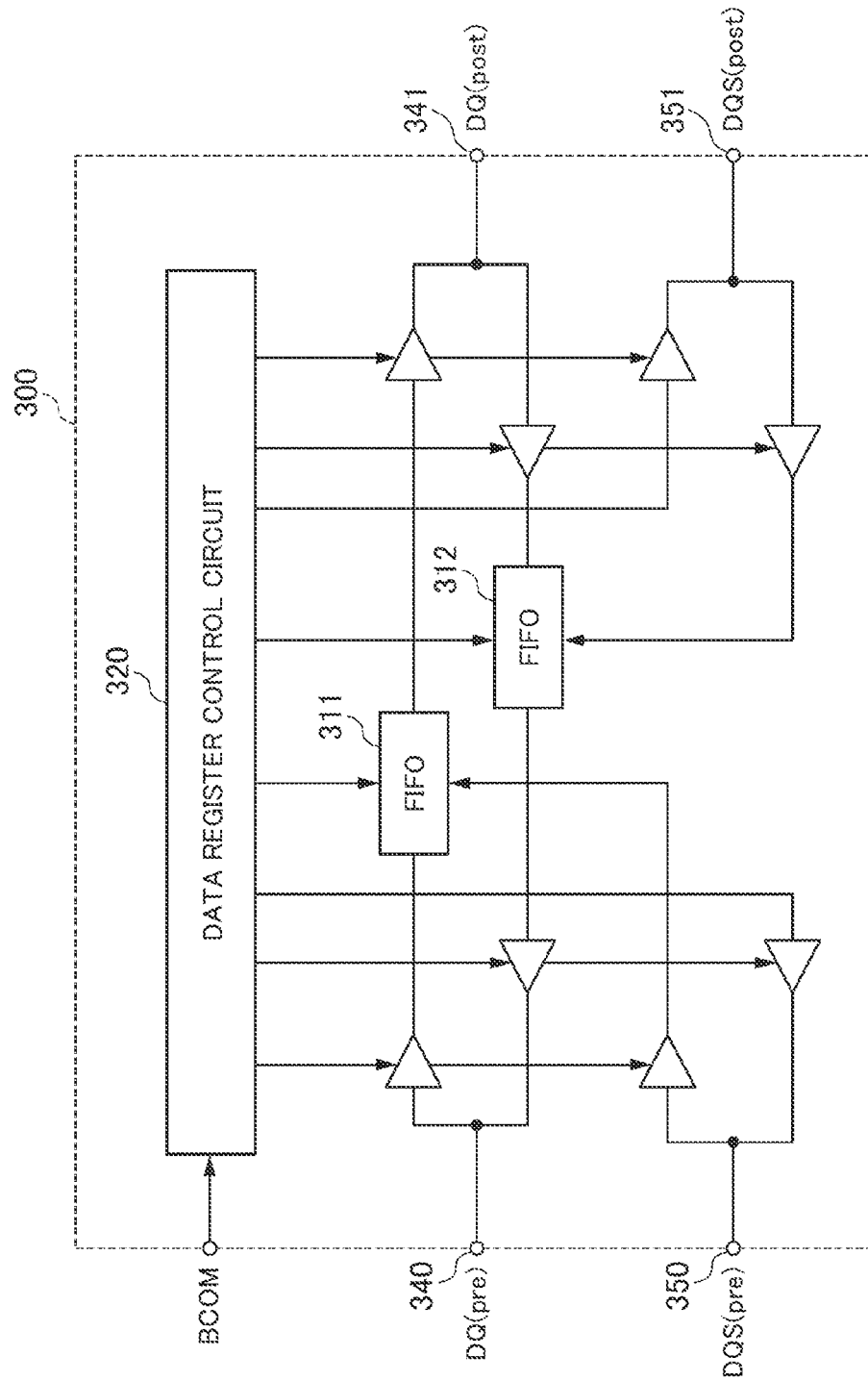
FIG. 6 is a block diagram showing the configuration of a data register buffer included in memory module according to the first embodiment.

Turning to FIG. 6, the data register buffer 300 includes a write FIFO circuit 311 and a read FIFO circuit 312. The write FIFO circuit 311 buffers the write data DQ supplied through an input/output terminal 340 in synchronization with the data strobe signal DQS supplied through an input/output terminal 350. The read FIFO circuit 312 buffers the read data DQ supplied through an input/output terminal 341 in synchronization with the data strobe signal DQS supplied through an input/output terminal 351. The input/output terminals 340 and 350 are connected to data connectors 122. In FIG. 6, the signals input/output through the input/output terminals 340 and 350 have signal names accompanied by the symbol (pre). The input/output terminals 341 and 351 are terminals connected to corresponding memory chips 200. In FIG. 6, the signals input/output through the input/output terminals 341 and 351 have signal names accompanied by the symbol (post).

It should be noted that the FIFO circuits 311 and 312 shown in FIG. 6 are circuits for inputting/outputting a single bit of data. In fact, the data register buffer 300 includes FIFO circuits 311 and 312 as many as the input/output data width. For example, when a data register buffer 300 inputs/outputs a single byte of data at a time, eight pairs of FIFO circuits 311 and 312 are needed.

The operation of various buffer circuits and the FIFO circuits 311 and 312 included in the data register buffer 300 is controlled by a data register control circuit 320. The data register control circuit 320 controls the operation of the data register buffer 300 based on a control signal BCOM which is supplied from the command address register buffer 401.

Figure 7:
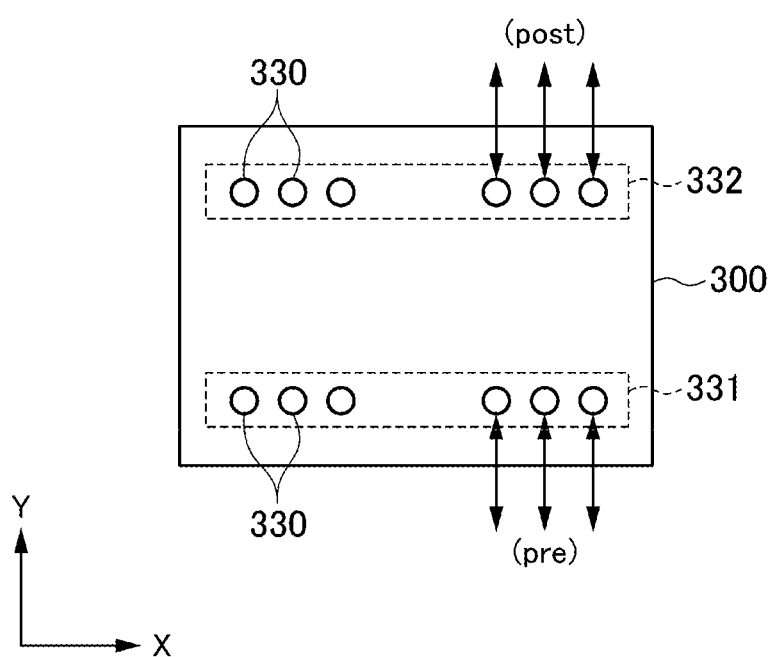
FIG. 7 is a schematic plan view for describing the arrangement of external terminals formed on the data register buffer shown in FIG. 6.

In FIG. 7, the reference numbers 330 designate external terminals belonging to data signals and data strobe signals among the external terminals formed on the data register buffer 300. As shown in FIG. 7, the external terminals of the data register buffer 300 are classified into a first group 331 and a second group 332. The first group 331 includes terminals connected to data connectors 122, including the input/output terminals 340 and 350 shown in FIG. 6. In other words, the external terminals for inputting/outputting the signals accompanied by the symbol (pre) are included. The second group 332 includes terminals connected to the corresponding memory chips 200, including the input/output terminals 341 and 351 shown in FIG. 6. In other words, the external terminals for inputting/outputting the signals accompanied by the symbol (post) are included.

As shown in FIG. 7, the first group 331 and the second group 332 are arranged in the Y direction. Each group includes a plurality of external terminals 330 arranged in the X direction.

The overall configuration of the data register buffer 300 has been described above. Next, the configuration of the command address register buffer 401 will be described.

Figure 8:
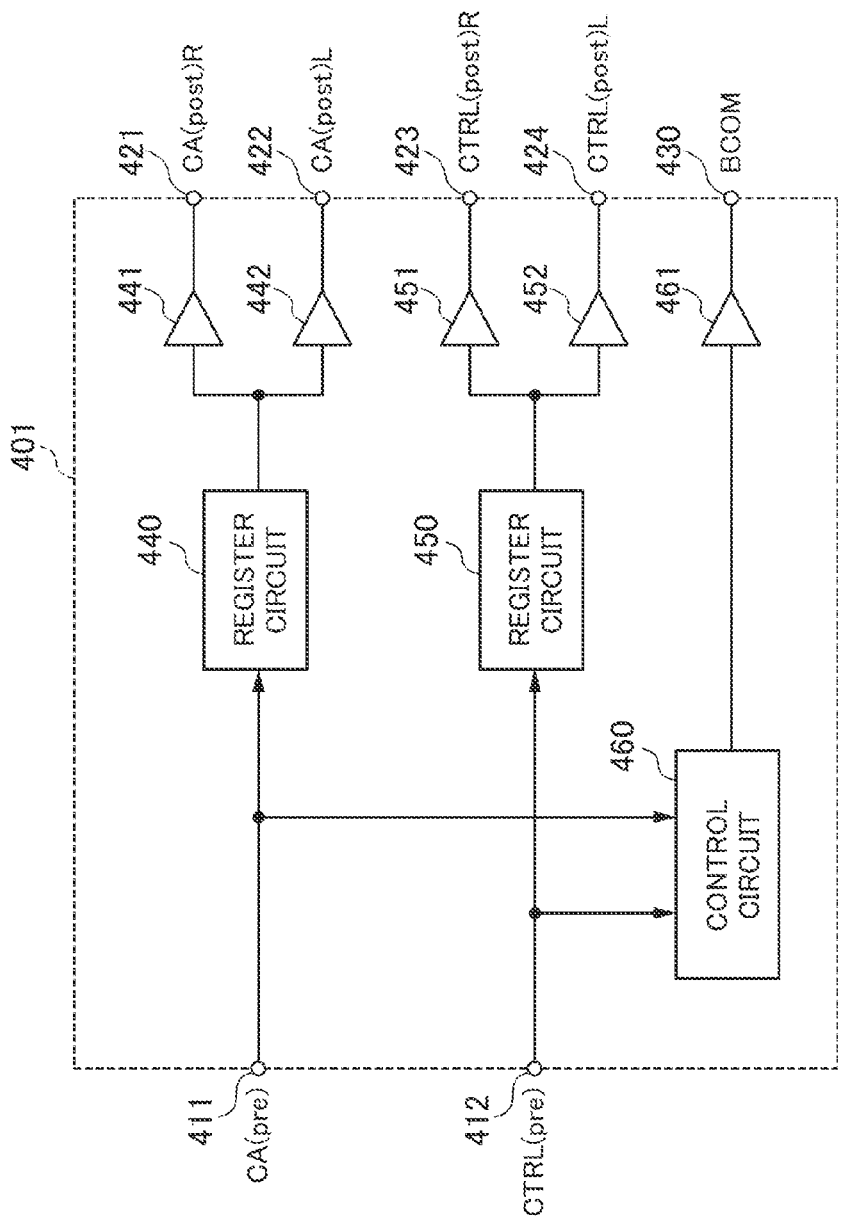
FIG. 8 is a block diagram showing the configuration of the command address register buffer included in memory module according to the first embodiment.

Turning to FIG. 8, the command address register buffer 401 includes input terminals 411 and 412 which are connected to the command address connectors 121, output terminals 421 to 424 which are connected to the memory chips 200, and an output terminal 430 which is connected to the data register buffers 300.

The command address signal CA and the control signal CTRL supplied from the memory controller 12 are input to the input terminals 411 and 412, respectively. In FIG. 8, the signals input to the input terminals 411 and 412 have signal names accompanied by the symbol (pre). The command address signal CA(pre) input through the input terminal 411 is buffered by a register circuit 440 before supplied to two systems of drivers 441 and 442. The drivers 441 and 442 are circuits that output a command address signal CA(post) through output terminals 421 and 422, respectively. As shown in FIG. 8, the command address signal CA(post) output from the driver 441 through the output terminal 421 is accompanied by the symbol R. The command address signal CA(post) output from the driver 442 through the output terminal 422 is accompanied by the symbol L. The command address signal CA(post)R and the command address signal CA(post)L have the same content.

Similarly, the control signal CTRL(pre) input through the input terminal 412 is buffered by a register circuit 450 before supplied to two systems of drivers 451 and 452. The drivers 451 and 452 are circuits that output a control signal CTRL (post) through output terminals 423 and 424, respectively. As shown in FIG. 8, the control signal CTRL output from the driver 451 through the output terminal 423 is accompanied by the symbol R. The control signal CTRL(post) output from the driver 452 through the output terminal 424 is accompanied by the symbol L. The control signal CTRL(post)R and the control signal CTRL(post)L have the same content.

The provision of the two output systems in the command address register buffer 401 reduces the load on the drivers 441, 442, 451, and 452.

The command address register buffer 401 further includes a control circuit 460. The control circuit 460 generates the control signal BCOM based on the command address signal CA(pre) and the control signal CTRL(pre). The generated control signal BCOM is supplied to the data register buffers 300 through a driver 461 and the output terminal 430.

Figure 9:
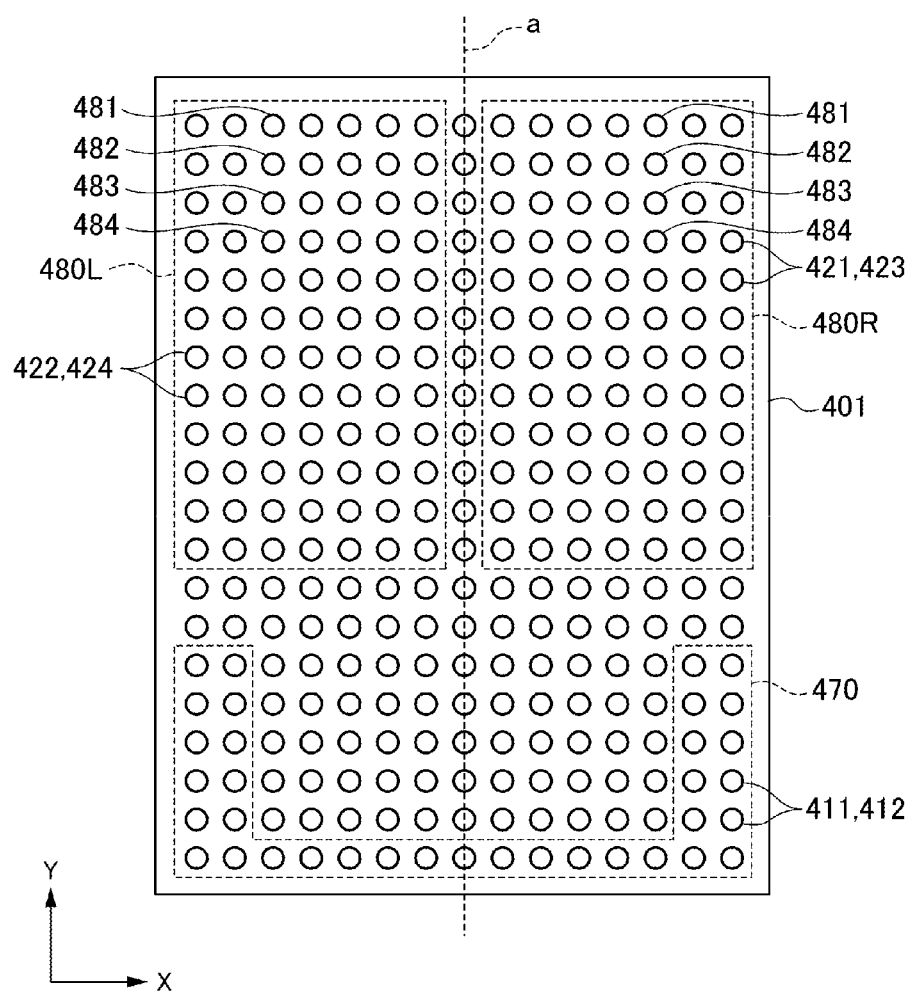
FIG. 9 is a schematic plan view for describing the arrangement of external terminals formed on the command address register buffer shown in FIG. 8.

The reference number 470 shown in FIG. 9 designates an area where the input terminals 411 and 412 formed on the command address register buffer 401 are arranged. The reference number 480R shown in FIG. 9 designates an area where the output terminals 421 and 423 formed on the command address register buffer 401 are arranged. In other words, the command address signal CA(post)R and the control signal CTRL(post)R are output from the area 480R. The reference number 480L shown in FIG. 9 designates an area where the output terminals 422 and 424 formed on the command address register buffer 401 are arranged. The command address signal CA(post)L and the control signal CTRL (post)L are output from the area 480L.

The command address signal CA(post)R and the control signal CTRL(post)R are supplied to the memory chips 200 that are mounted on the right side of the module substrate 110. The command address signal CA(post)L and the control signal CTRL(post)L are supplied to the memory chips 200 that are mounted on the left side of the module substrate 110. The output terminals 421 and 423 arranged in the area 480R and the output terminals 422 and 424 arranged in the area 480L are symmetrically laid out about the center axis a. The center axis a refers to the center line in the X direction, extending in the Y direction. For example, the signals output from terminals 481 to 484 arranged in the area 480R are the same as the signals output from terminals 481 to 484 arranged in the area 480L, respectively.

The overall configuration of the command address register buffer 401 has been described above. Next, the connections of the devices on the module substrate 110 will be described.

Figure 10:
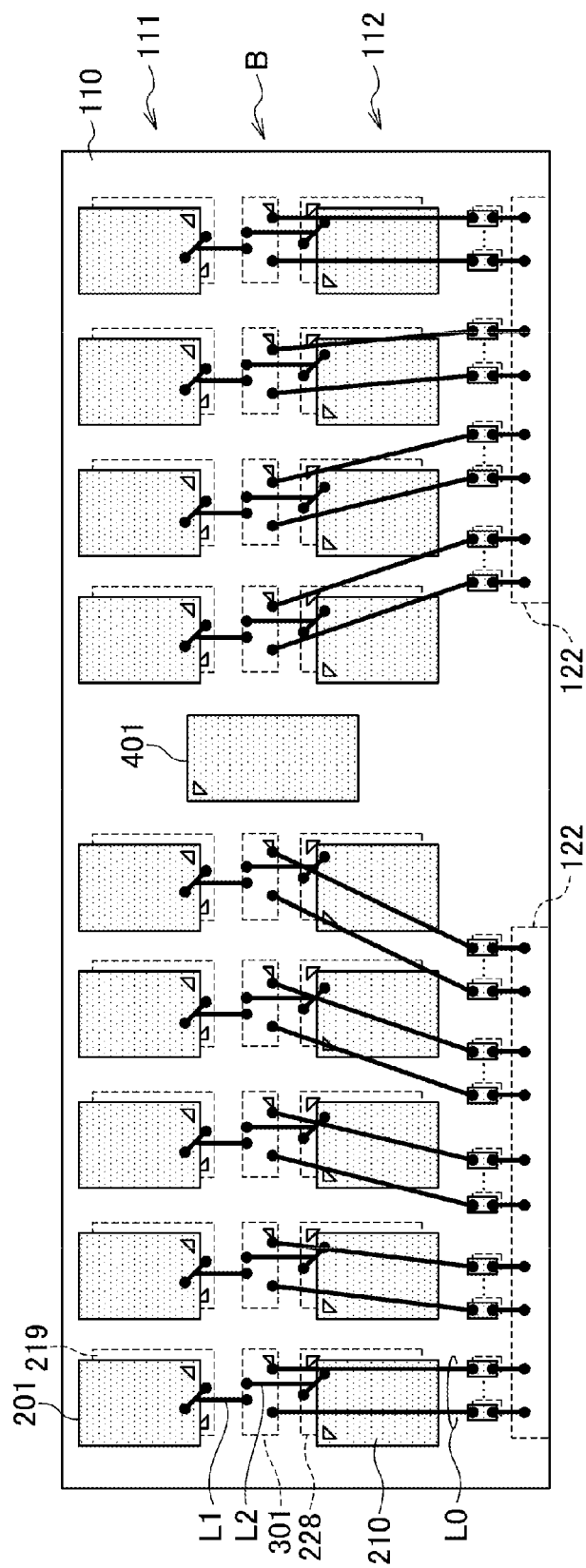
FIG. 10 is a schematic diagram for describing the connections between the data connectors and the memory chips.

The flow of data-system signals in a write operation will initially be described. As shown in FIG. 10, write data DQ input to the data connectors 122 is supplied to the data register buffers 300 through stub resistors 130. The stub resistors 130 are provided to prevent signal reflection due to an impedance mismatch occurring in the data connectors 122. Note that the provision of the stub resistors 130 is not essential for the present invention. According to the present embodiment, the data register buffers 300 are mounted on the register mounting area B which is sandwiched between the first row 111 and the second row 112 when seen in a plan view. The distances from the data connectors 112 to the data register buffers 300 are relatively large. Data lines L0 connecting the data connectors 122 and the data register buffers 300 thus have large wiring lengths, which facilitate signal reflection. The stub resistors 130 are therefore desirably provided to prevent the signal reflection.

The write data DQ input to each data register buffer 300 is buffered by the data register buffer 300 before supplied to corresponding memory chips 200. As described previously, the corresponding memory chips 200 refer to the four memory chips 200 having the same X coordinate as that of the data register buffer 300. For example, the write data DQ output from the data register buffer 301 is supplied to the four memory chips 201, 210, 219, and 228. Two memory chips mounted in overlapping positions on the front and back of the module substrate 110 belong to respective different ranks. Such memory chips share the same data wiring. For example, the write data DQ is supplied to the memory chips 201 and 219 through the same data line L1. The write data DQ is supplied to the memory chips 210 and 228 through the same data line L2. It will be appreciated that the write data DQ is supplied to the memory chips belonging to the same rank, like the memory chips 201 and 210, through different data lines.

In a read operation, the flow of data-system signals is reverse to the foregoing. Read data DQ read from two memory chips belonging to a selected rank is supplied to the corresponding data register buffer 300. The read data DQ is buffered by the data register buffer 300 before supplied to the data connectors 122 through the stub resistors 130.

As shown in FIG. 10, according to the present embodiment, the data register buffers 300 are mounted on the register mounting area B which is sandwiched between the first row 111 and the second row 112 in a plan view. When seen from each data register buffer 300, two memory chips lying above and below are simultaneously activated. The memory chips 200 belonging to the first row 111 and the memory chips 200 belonging to the second row 112 are mounted in 180° different directions. The areas 250DQ (see FIG. 5) of the memory chips 200 are therefore all positioned closer to the data register buffers 300.

Consequently, the data-system wiring can be laid out on the module substrate 110 so that the lines L1 and the lines L2 connecting the data register buffers 300 and the respective corresponding four memory chips 200 have the smallest and constant wiring lengths. In a write operation, write data DQ therefore reach the memory chips 200 mounted on the first row 111 and the memory chips 200 mounted on the second row 112 almost at the same time. In a read operation, read data DQ output from the memory chips 200 mounted on the first row 111 and read data DQ output from the memory chips 200 mounted on the second row 112 reach the data register buffers 300 almost at the same time. In other words, data skew ascribable to the mounting positions of the memory chips 200 is extremely small. As a result, data can be properly input and output without the implementation of synchronous circuits such as a DLL circuit on the memory chips 200. The ranks have little difference in the data skew, either.

Figure 11:
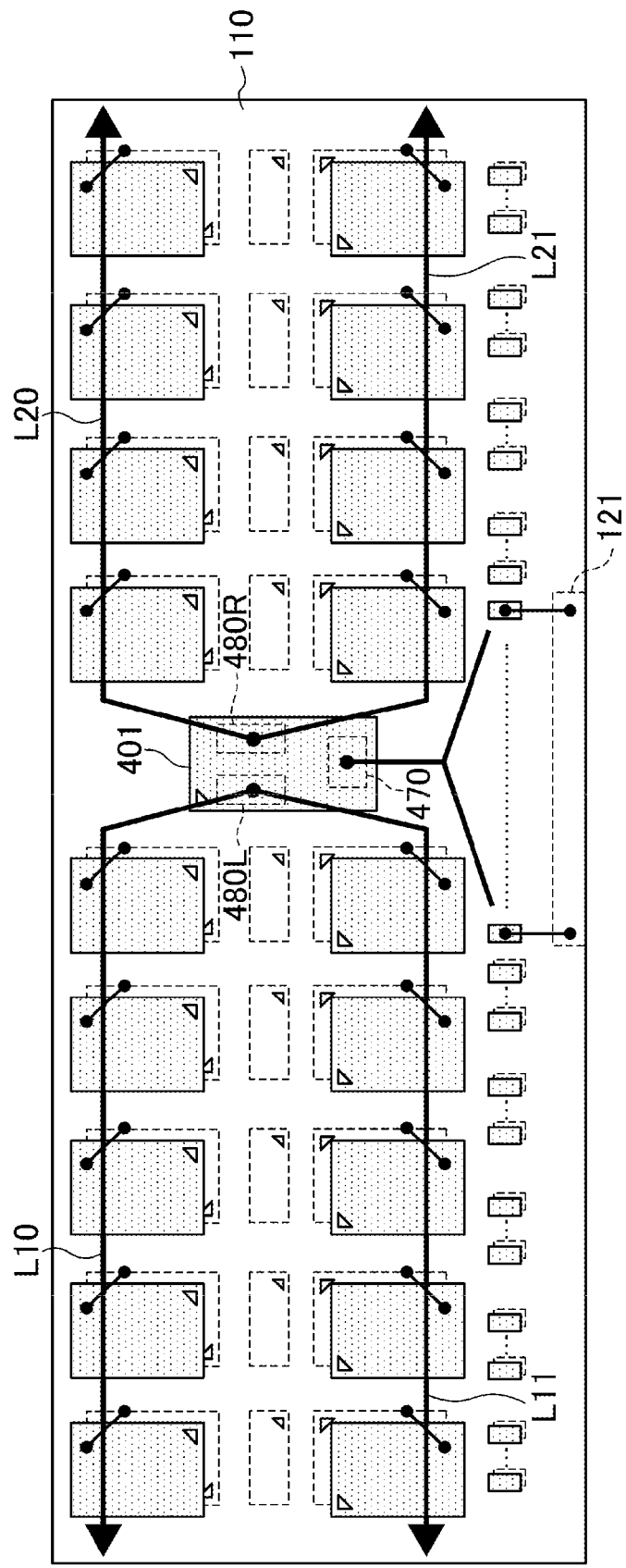
FIG. 11 is a schematic diagram for describing the connections between the command address connectors and the memory chips.

As shown in FIG. 11, the command address signal CA and the control signal CTRL input to the command address connectors 121 are supplied to the command address register buffer 401 through the sub resistors 130. As has been described with reference to FIG. 9, the input terminals 411 and 412 formed on the command address register buffer 401 are arranged in the area 470. The command address register buffer 401 buffers the command address signal CA and the control signal CTRL, and supplies the signals to the memory chips 200 through the output terminals 421 to 424. The memory chips 200 mounted on the right side of the module substrate 110 are supplied with the command address CA and the control signal CTRL through the output terminals 421 and 423 arranged in the area 480R and lines L20 and L21. The memory chips 200 mounted on the left side of the module substrate 110 are supplied with the command address signal CA and the control signal CTRL through the output terminals 422 and 424 arranged in the area 480L and lines L10 and L11.

Of the signals output from the command address register buffer 401, the command address signal CA is supplied to all the memory chips 201 to 236 in common. Of the signals output from the command address register buffer 401, the control signal CTRL is supplied rank by rank. As a result, either one of the ranks is exclusively activated.

The prototype memory module which the inventors have conceived in the process of achieving the present invention will be explained with reference to FIG. 12.

Figure 12:
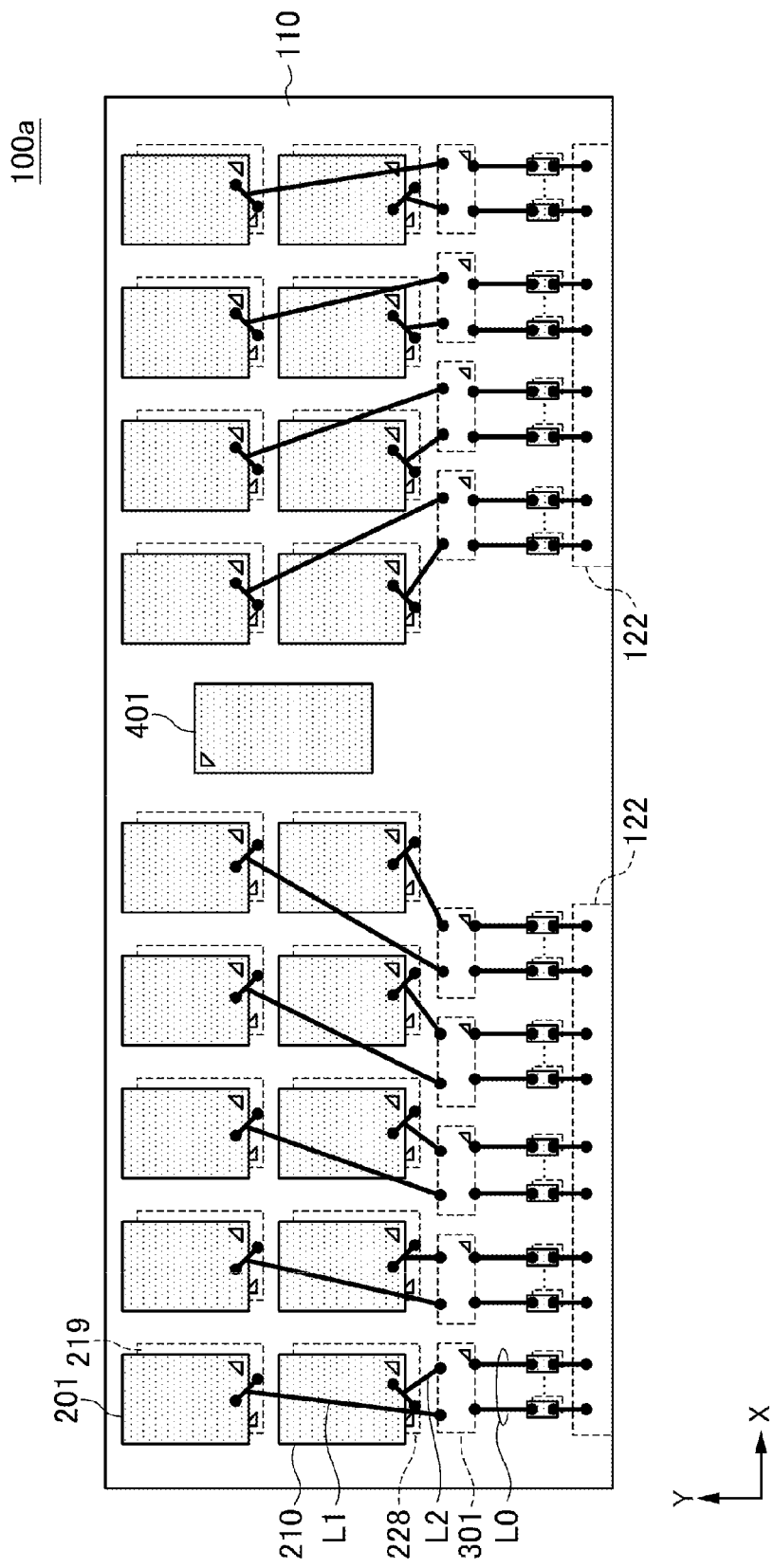
FIG. 12 is a schematic diagram for describing the connections between the data connectors and the memory chips of a prototype memory module which the inventors have conceived in the process of achieving the present invention.

In the prototype memory module 100a shown in FIG. 12, the data register buffers 301 to 309 are arranged between the data connectors 122 and the memory chips 201 to 236. In such a layout, the distances from the data register buffers 300 to the corresponding memory chips 200 vary greatly between the first row 111 and the second row 112. The data lines L1 are considerably longer than the data lines L2. In a write operation, write data DQ therefore reaches the memory chips 200 mounted on the second row 112 before the memory chips 200 mounted on the first row 111. In a read operation, read data DQ output from the memory chips 200 mounted on the second row 112 reaches the data register buffers 300 before read data DQ output from the memory chips 200 mounted on the first row 111 does. The memory module 100a thus causes data skew depending on the mounting positions of the memory chips 200 in the Y direction. Skew also occurs depending on the mounting positions of the memory chips 200 in the X direction because each data register buffer 300 and the corresponding four memory chips 200 do not always have the same X coordinate.

In contrast, according to the memory module 100 of the present embodiment, such skew can be significantly reduced to provide high signal quality. Unlike the prototype memory module 100a, the memory module 100 is free from the disadvantage of increased wiring density.

Next, a second preferred embodiment of the present invention will be described.

Figure 13:
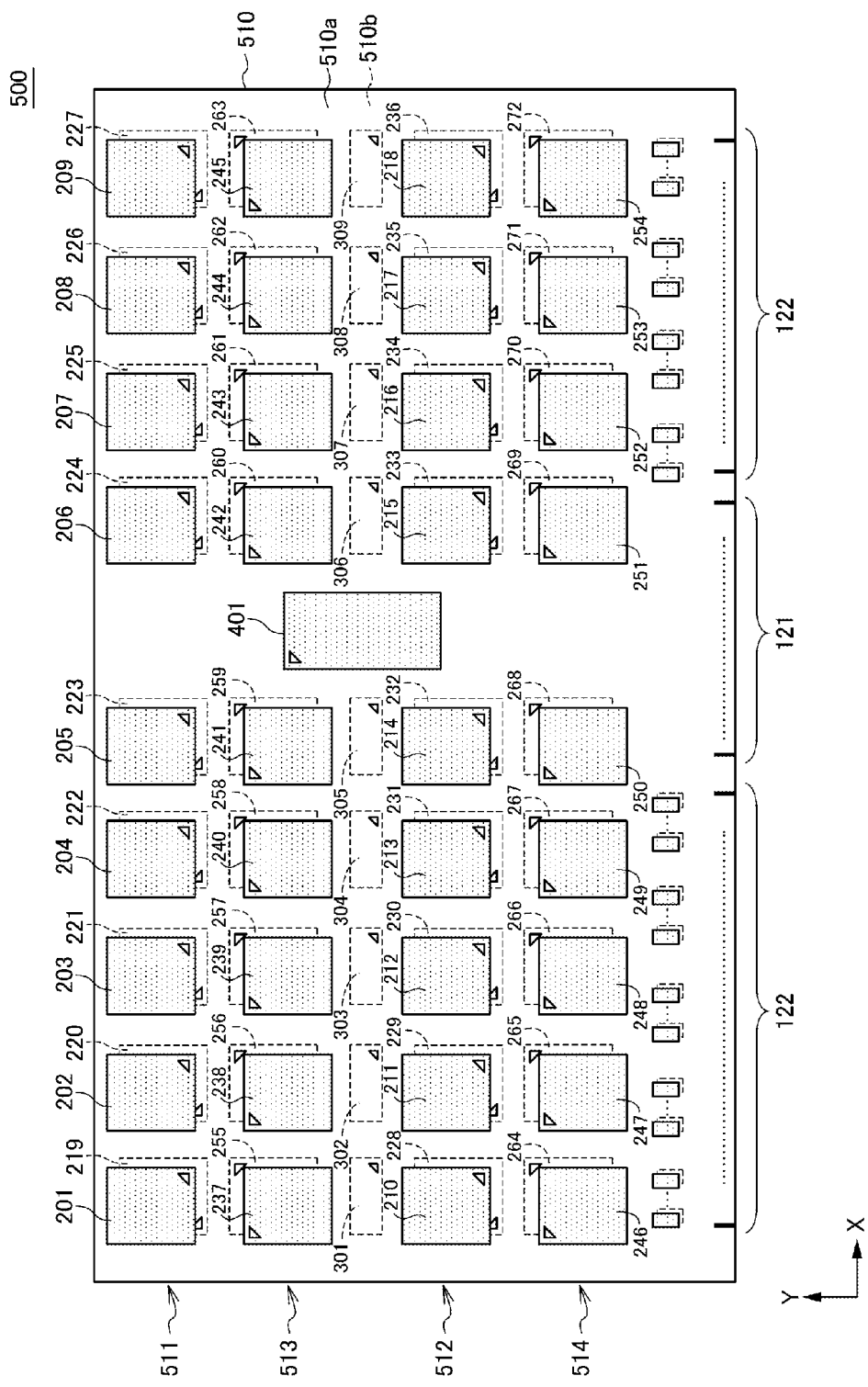
FIG. 13 is a schematic diagram showing the configuration of a memory module according to the second embodiment of the present invention.

As shown in FIG. 13, the memory module 500 according to the second embodiment of the present invention includes a module substrate 510, and 72 memory chips 201 to 272, nine data register buffers 301 to 309, and a command address register buffer 401 which are mounted on the module substrate 510. As employed herein, the memory chips 201 to 272 may be referred to simply as "memory chips 200" if no distinction is needed.

The memory chips 201 to 272 are arranged on the module substrate 510 in four rows when seen in a plan view. Specifically, the memory chips 201 to 209 and 219 to 227 are arranged in a first row 511 which is the topmost row. The memory chips 237 to 245 and 255 to 263 are arranged in a third row 513 which is the second row from the top. The memory chips 210 to 218 and 228 to 236 are arranged in a second row 512 which is the second row from the bottom. The memory chips 246 to 254 and 264 to 272 are arranged in a fourth row 514 which is the bottom row.

The memory chips 201 to 218 are mounted in the same direction. The memory chips 219 to 236 are mounted in the same direction. The memory chips 237 to 254 are mounted in the same direction. The memory chips 255 to 272 are mounted in the same direction. The memory chips 201 to 218 and the memory chips 237 to 254 are mounted in 180° different directions. The memory chips 219 to 236 and the memory chips 255 to 272 are mounted in 180° different directions. In the present invention, the memory chips 237 to 245 each may be referred to as a "fifth memory device." The memory chips 246 to 254 each may be referred to as a "sixth memory device." The memory chips 255 to 263 each may be referred to as a "seventh memory device." The memory chips 264 to 272 each may be referred to as an "eighth memory device."

Figure 14:
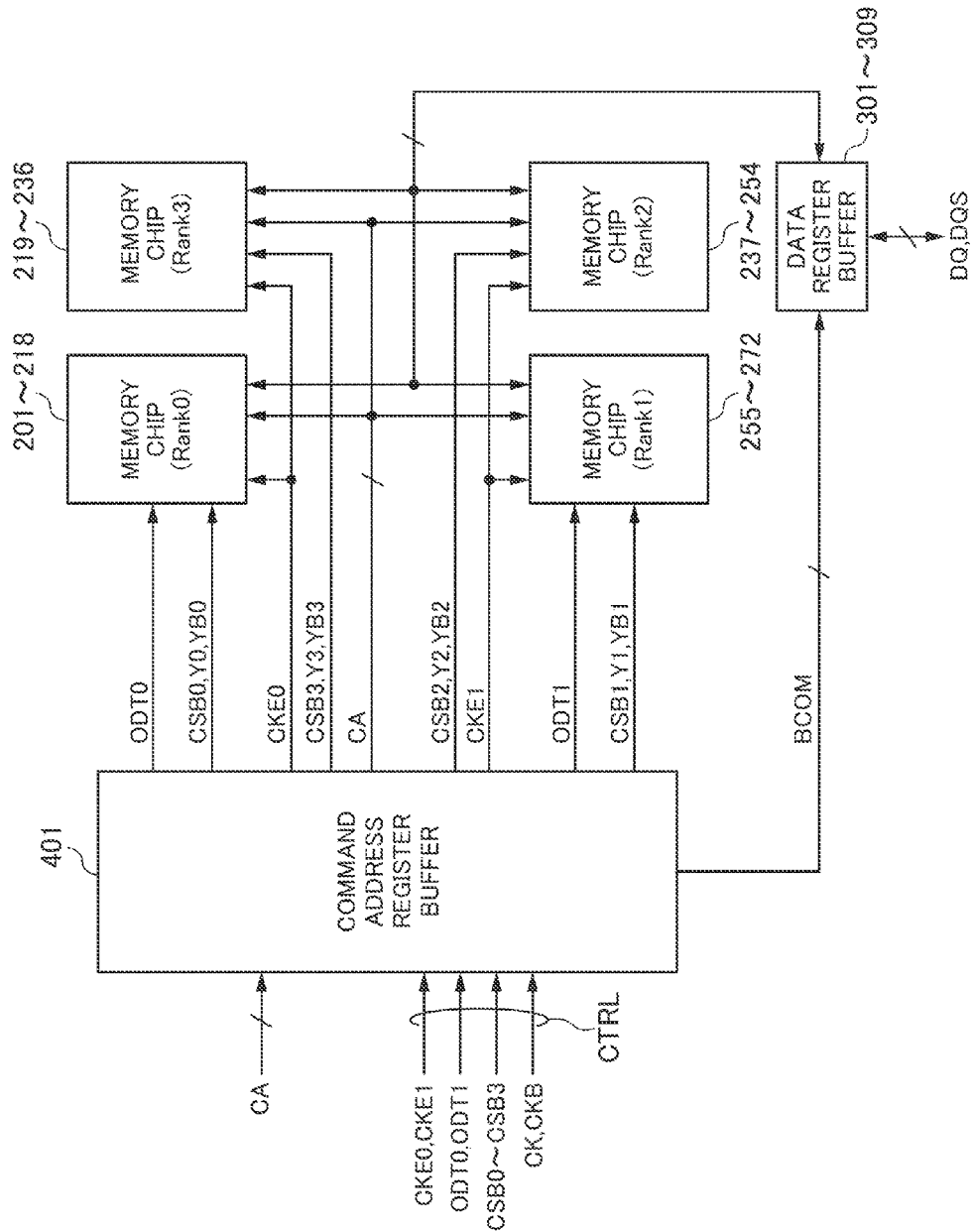
FIG. 14 is a block diagram for describing the connections of the devices included in the memory module according to the second embodiment.

The memory module 500 according to the present embodiment has a so-called four-rank configuration. FIG. 14 is a block diagram for describing the connections of the ranks. As shown in FIG. 14, the ranks are exclusively activated by respective chip select signals CS0B to CS3B. In the present embodiment, the memory chips 201 to 218 constitute rank0. The memory chips 255 to 272 constitute rank1. The memory chips 237 to 254 constitute rank2. The memory chips 219 to 236 constitute rank3. Clocks signals Y0 to Y3 and YB0 to YB3 are supplied to the respective corresponding ranks. Rank0 and rank3 share a clock enable signal CKE0. Rank1 and rank2 share a clock enable signal CKE1. On-die termination signals ODT0 and ODT1 are supplied to the rank0 and rank1, respectively. No on-die termination signal is supplied to rank2 and rank3.

The mounting positions of the memory chips 200 and the data register buffers 300 will be explained in more detail with reference to FIGS. 15A and 15B.

Figure 15A:
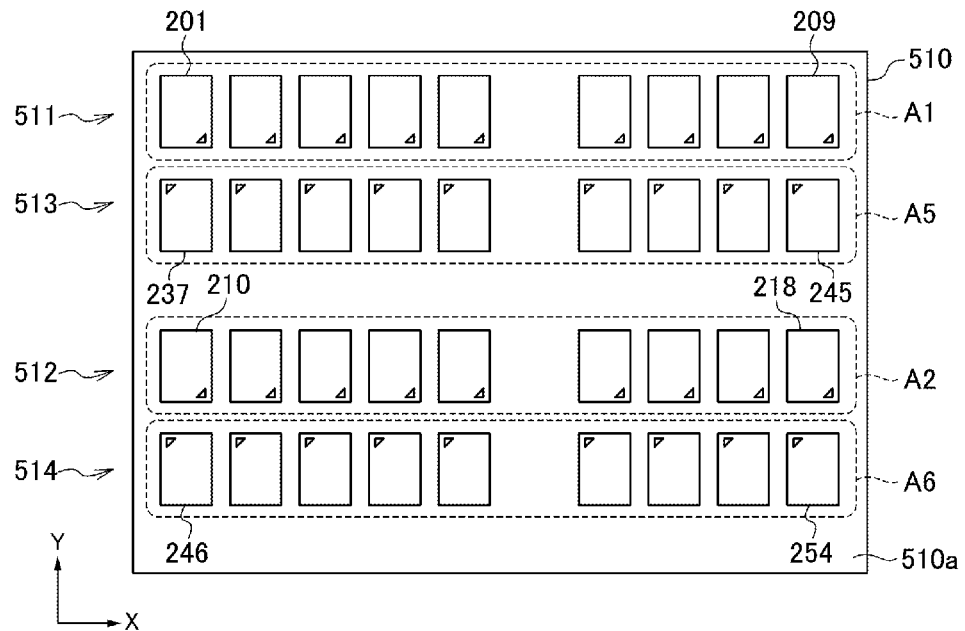
FIG. 15A shows the layout of the devices mounted on one main surfaces of the module substrate according to the second embodiment.

As shown in FIG. 15A, the one main surface 510a of the module substrate 510 includes first, second, fifth, and sixth memory mounting areas A1, A2, A5, and A6. The first memory mounting area A1 is defined in a portion corresponding to the first row 511. The second memory mounting area A2 is defined in a portion corresponding to the second row 512. The fifth memory mounting area A5 is defined in a portion corresponding to the third row 513. The sixth memory mounting area A6 is defined in a portion corresponding to the fourth row 514. The first memory mounting area A1 is the area where the memory chips 201 to 209 are arranged in the X direction. The second memory mounting area A2 is the area where the memory chips 210 to 218 are arranged in the X direction. The fifth memory mounting area A5 is the area where the memory chips 237 to 245 are arranged in the X direction. The sixth memory mounting area A6 is the area where the memory chips 246 to 254 are arranged in the X direction.

Figure 15B:
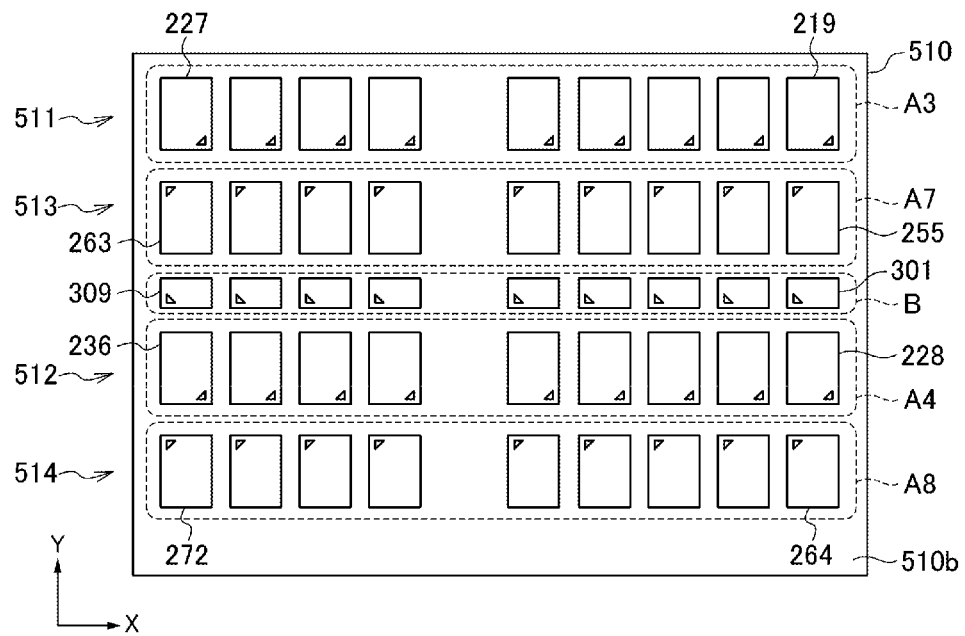
FIG. 15B shows the layout of the devices mounted on the other main surface of the module substrate according to the second embodiment.

As shown in FIG. 15B, the other main surface 510b of the module substrate 510 includes third, fourth, seventh, and eighth memory mounting areas A3, A4, A7, and A8. The third memory mounting area A3 is defined in a portion corresponding to the first row 511. The fourth memory mounting area A4 is defined in a portion corresponding to the second row 512. The seventh memory mounting area A7 is defined in a portion corresponding to the third row 513. The eighth memory mounting area A8 is defined in a portion corresponding to the fourth row 514. The third memory mounting area A3 is the area where the memory chips 219 to 227 are arranged in the X direction. The fourth memory mounting area A4 is the area where the memory chips 228 to 236 are arranged in the X direction. The seventh memory mounting area A7 is the area where the memory chips 255 to 263 are arranged in the X direction. The eighth memory mounting area A8 is the area where the memory chips 264 to 272 are arranged in the X direction.

Of the memory chips 201 to 272 mounted on the memory mounting areas A1 to A8, eight memory chips having the same X coordinate are connected in common to one of the data register buffers 300 that has the same X coordinate. For example, the memory chips 201, 210, 219, 228, 237, 246, 255, and 264 are connected in common to the data register buffer 301.

As shown in FIG. 15B, the data register buffers 301 to 309 are arranged in the X direction in a register mounting area B which is sandwiched between the third row 513 and the second row 512 when seen in a plan view. In the present embodiment, the register mounting area B is defined on, though not limited to, the other main surface 510b of the module substrate 510.

Figure 16:
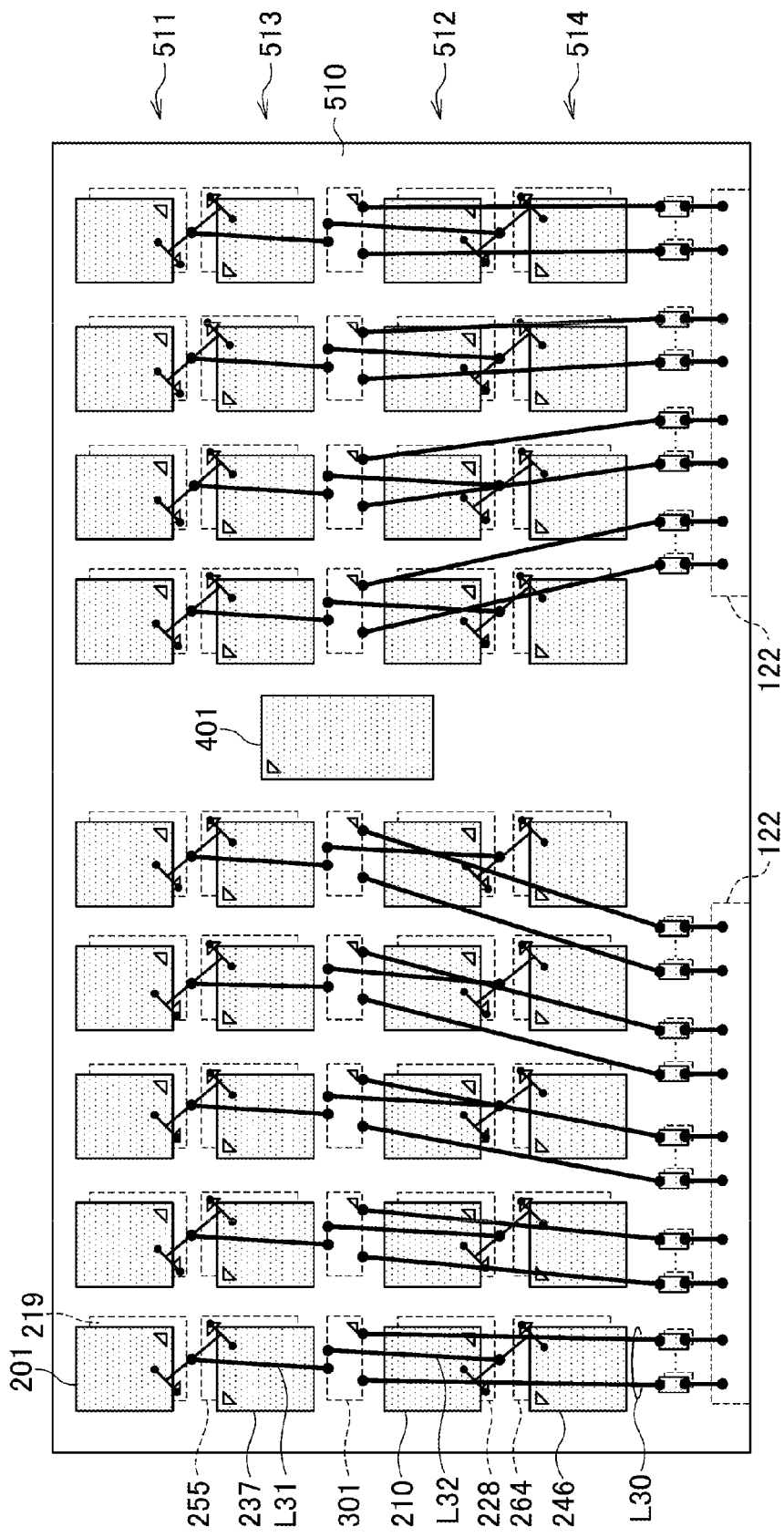
FIG. 16 is a schematic diagram for describing the connections between the data connectors and the memory chips according to the second embodiment.

The flow of data-system signals in a write operation will initially be described. As shown in FIG. 16, write data DQ input to the data connectors 122 is supplied to the data register buffers 300 through stub resistors 130. The write data DQ input to each data register buffer 300 is buffered by the data register buffer 300 before supplied to corresponding memory chips 200. As has been previously described, the corresponding memory chips 200 refer to the eight memory chips 200 having the same X coordinate as that of the data register buffer 300. In a read operation, the flow of data-system signals is reverse to the foregoing.

In the present embodiment, half the input/output terminals 341 and 351 formed on the data register buffers 300 (see FIG. 6) are connected to lines L31. The other half are connected to lines L32. The lines L31 extend upward when seen from the data register buffers 300. Each line L31 is branched out between the first row 511 and the third row 513 and connected to the corresponding four memory chips 200 in common. Similarly, the lines L32 extend downward when seen from the data register buffers 300. Each line L32 is branched out between the second row 512 and the fourth row 514 and connected to the corresponding four memory chips 200 in common. The lines L31 and the lines L32 have almost the same lengths. Besides, the wiring distances from the branching points of the lines L31 and L32 to the respective memory chips 200 are almost the same.

As shown in FIG. 16, in the present embodiment, the memory chips 200 belonging to the first row 511 and the memory chips 200 belonging to the third row 513 are mounted in 180° different directions. The branching points of the lines L31 are located between the memory chips 200. Similarly, the memory chips 200 belonging to the second row 512 and the memory chips 200 belonging to the fourth row 514 are mounted in 180° different directions. The branching points of the lines L32 are located between the memory chips 200.

With such a configuration, the data-system wiring on the module substrate 510 can be laid out so that the wiring lengths between the data register buffers 300 and the respective corresponding eight memory chips 200 are the smallest and constant. In a write operation, write data DQ therefore reach the memory chips 200 mounted on the respective rows almost at the same time. In a read operation, read data DQ output from the memory chips 200 mounted on the respective rows reach the data register buffers 300 almost at the same time. Data skew depending on the mounting positions of the memory chips 200 is thus significantly reduced like the first embodiment.

Figure 17:
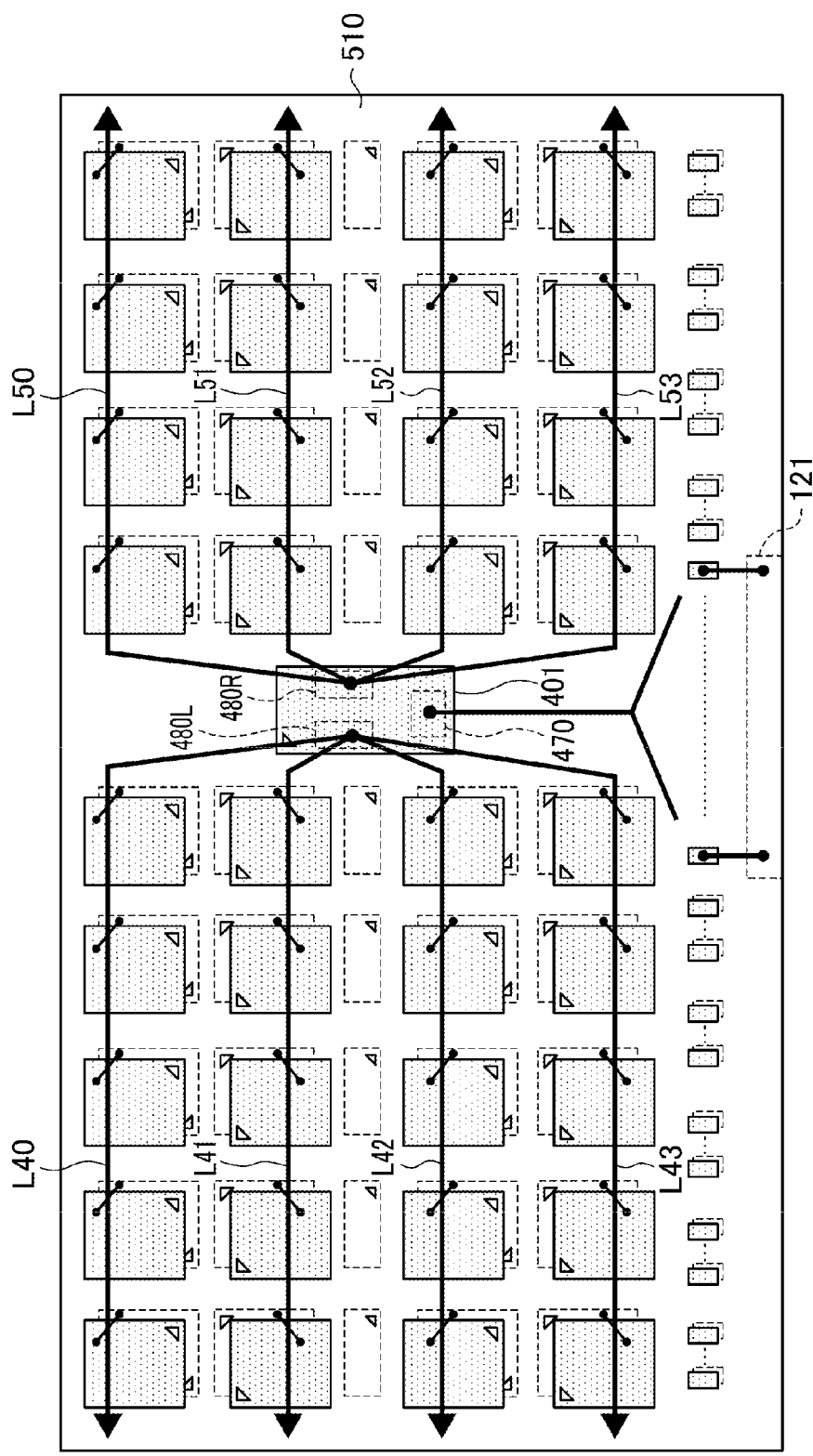
FIG. 17 is a schematic diagram for describing the connections between the command address connectors and the memory chips according to the second embodiment.

As shown in FIG. 17, the command address signal CA and the control signal CTRL input to the command address connectors 121 are supplied to the command address register buffer 401 through the stub resistors 130. As has been described with reference to FIG. 9, the input terminals 411 and 412 formed on the command address register buffer 400 are arranged in the area 470. The command address register buffer 401 buffers the command address signal CA and the control signal CTRL, and supplies the signals to the memory chips 200 through the output terminals 421 to 424. The memory chips 200 mounted on the right side of the module substrate 510 are supplied with the command address signal CA and the control signal CTRL through the output terminals 421 and 423 arranged in the area 480R and lines L50 to L53. The memory chips 200 mounted on the left side of the module substrate 510 are supplied with the command address signal CA and the control signal CTRL through the output terminals 422 and 424 arranged in the area 480L and lines L40 to L43.

Figure 18:
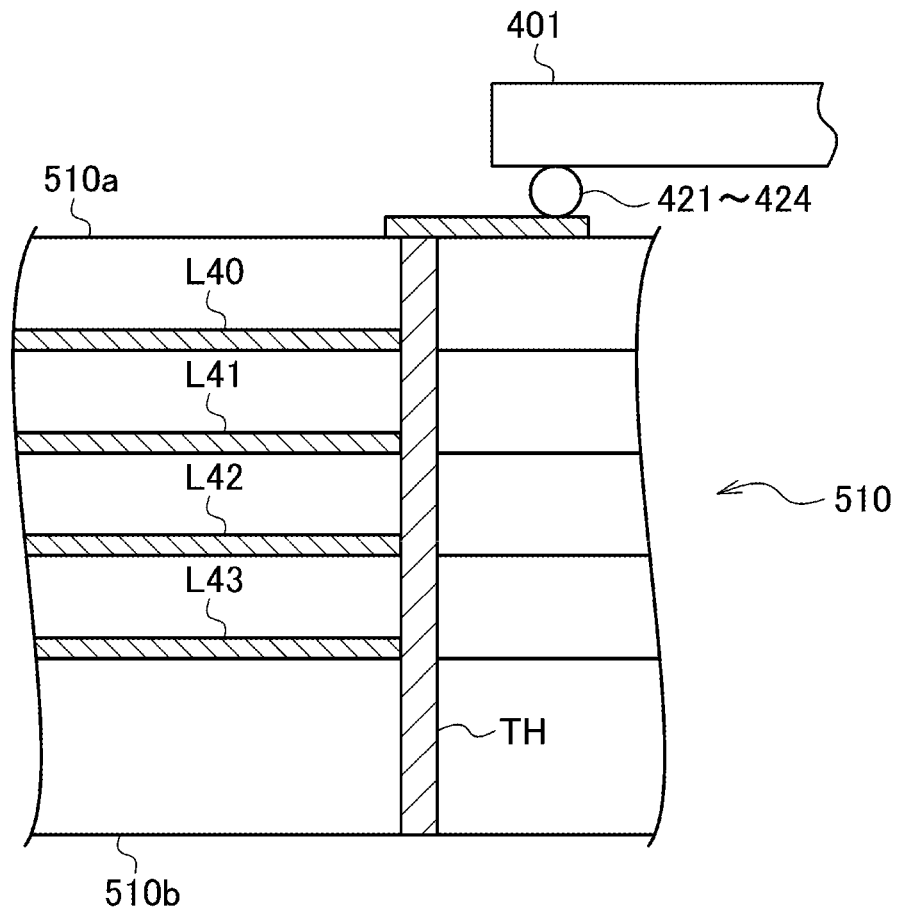
FIG. 18 is an enlarged cross sectional view of the module substrate according to the second embodiment.

In the present embodiment, the command address signals CA and the control signals CTRL output from the areas 480R and 480L are each branched into four, which are respectively supplied to the memory chips 200 belonging to the first row 511 to the fourth row 514. To branch a signal line into four in the module substrate 510, four wiring layers may be used as shown in FIG. 18, for example. The lines L40 to L43 formed on the respective wiring layers are connected to the same through hole conductor TH.

As has been described above, the memory module 500 according to the present embodiment can provide the same effects as those of the memory module 100 according to the first embodiment, and can even provide a higher memory capacity.

Next, a third preferred embodiment of the present invention will be described.

Figure 19:
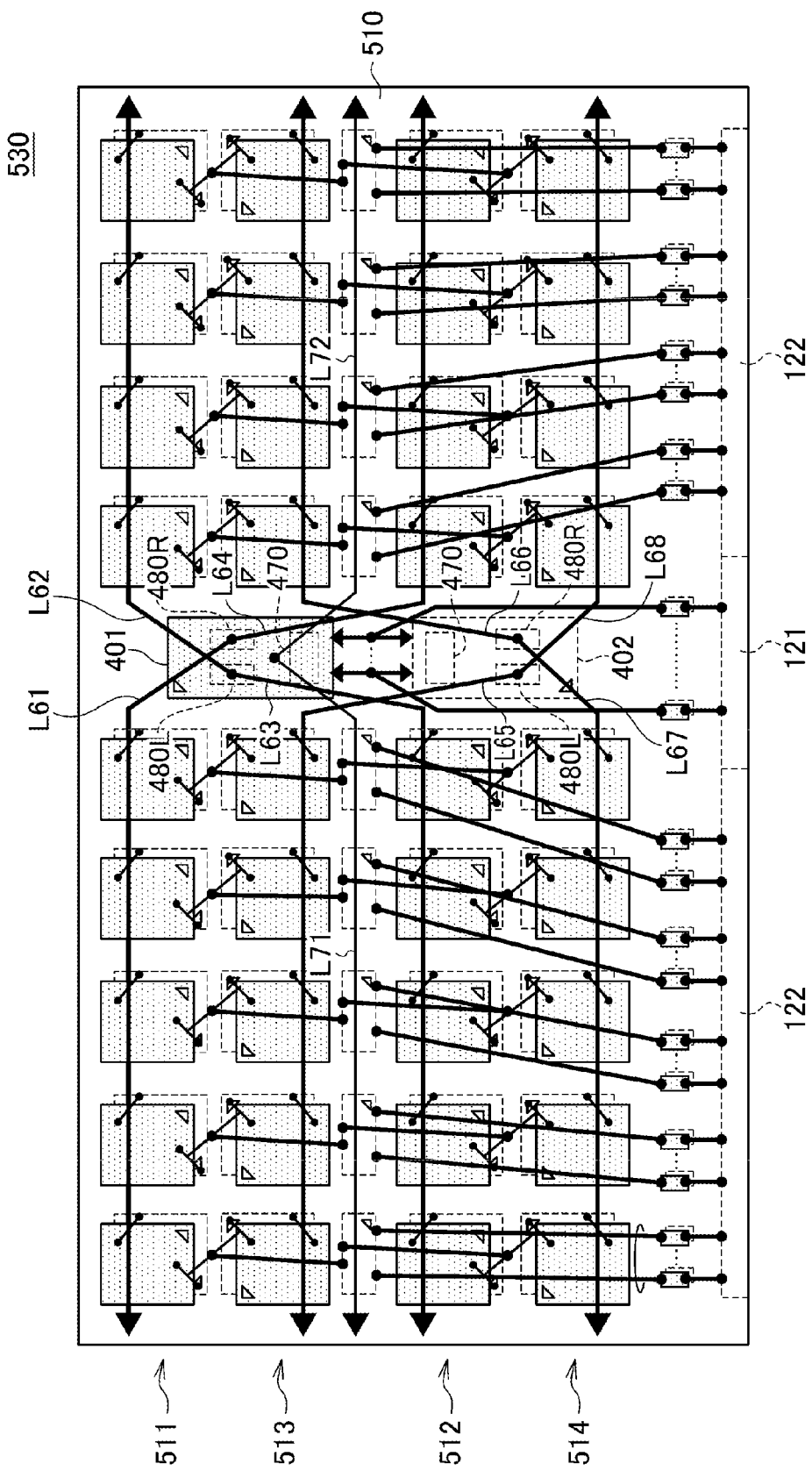
FIG. 19 is a schematic diagram showing the configuration of a memory module according to the third embodiment of the present invention.

As shown in FIG. 19, the memory module 530 according to the third embodiment of the present invention differs from the memory module 500 of the second embodiment in the inclusion of two command address register buffers 401 and 402. The command address register buffers 401 and 402 are chips having the same configuration. The command address register buffer 401 is mounted on one of the main surfaces 510a of the module substrate 510. The command address register buffer 402 is mounted on the other main surface 510b of the module substrate 510. The mounting direction of the command address register buffer 401 with respect to the one main surface 510a and the mounting direction of the command address register buffer 402 with respect to the other main surface 510b are 180° different from each other. Consequently, the areas 470 of the command address register buffers 401 and 402 where the input terminals 411 and 412 are arranged are opposed to each other.

Figure 20:
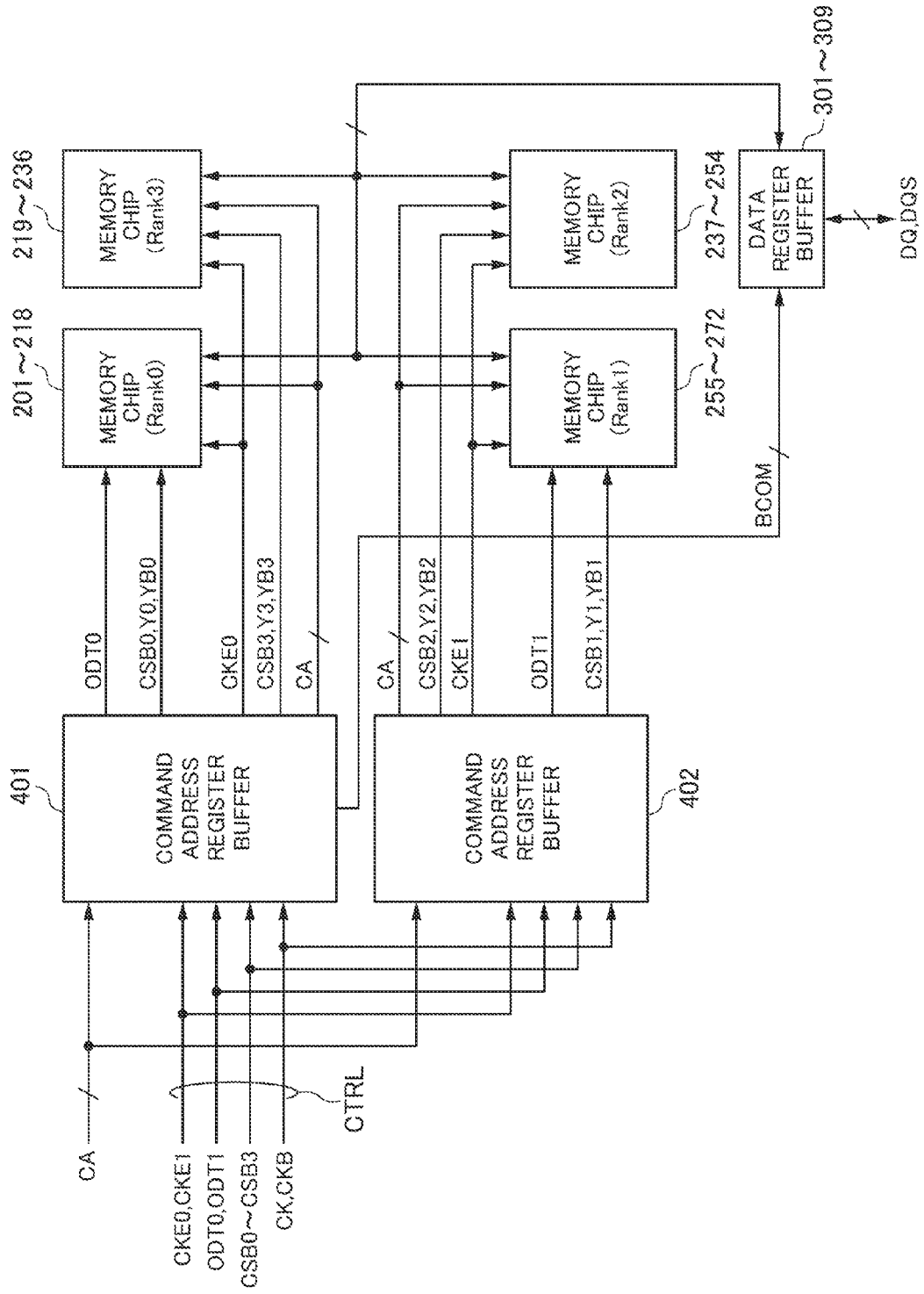
FIG. 20 is a block diagram for describing the connections of the devices according to the third preferred embodiment.

As shown in FIG. 20, the command address register buffer 401 is allocated to the memory chips 200 belonging to rank0 and rank3. The command address register buffer 402 is allocated to the memory chips 200 belonging to rank1 and rank2. The signal for controlling the data register buffers 300 is supplied only from the command address register buffer 401, not from the command address register buffer 402. The reason is that the data register buffers 300 perform the same operations on each rank, and the same control signal BCOM need not be supplied from both the command address register buffers 401 and 402.

Returning to FIG. 19, the connections between the command address register buffers 401 and 402 and the memory chips 200 will be described in more detail. Of the memory chips 201 to 209 and 219 to 227 mounted on the first row 511, the memory chips 201 to 205 and 219 to 223 arranged on the left of the command address register buffers 401 and 402 are connected in common to a line L61. The line L61 is connected to the area 480R of the command address register buffer 401. The memory chips 206 to 209 and 224 to 227 arranged on the right of the command address register buffers 401 and 402 are connected in common to a line L62. The line L62 is connected to the area 480L of the command address register buffer 401.

Of the memory chips 210 to 218 and 228 to 236 mounted on the second row 512, the memory chips 210 to 214 and 228 to 232 arranged on the left of the command address register buffers 401 and 402 are connected in common to a line L63. The line L63 is connected to the area 480L of the command address register buffer 401. The memory chips 215 to 218 and 233 to 236 arranged on the right of the command address register buffers 401 and 402 are connected in common to a line L64. The line L64 is connected to the area 480R of the command address register buffer 401.

The line L61 and the line L64 are two lines branched from the area 480R of the command address register buffer 401. The line L62 and the line L63 are two lines branched from the area 480L of the command address register buffer 401.

Of the memory chips 237 to 245 and 255 to 263 mounted on the third row 513, the memory chips 237 to 241 and 255 to 259 arranged on the left of the command address register buffers 401 and 402 are connected in common to a line L65. The line L65 is connected to the area 480L of the command address register buffer 402. The memory chips 242 to 245 and 260 to 263 arranged on the right of the command address register buffers 401 and 402 are connected in common to a line L66. The line L66 is connected to the area 480R of the command address register buffer 402.

Of the memory chips 246 to 254 and 264 to 272 mounted on the fourth row 514, the memory chips 246 to 250 and 264 to 268 arranged on the left of the command address register buffers 401 and 402 are connected in common to a line L67. The line L67 is connected to the area 480R of the command address register buffer 402. The memory chips 251 to 254 and 269 to 272 arranged on the right of the command address register buffers 401 and 402 are connected in common to a line L68. The line L68 is connected to the area 480L of the command address register buffer 402.

The line L65 and the line L68 are two lines branched from the area 480L of the command address register buffer 402. The line L66 and the line L67 are two lines branched from the area 480R of the command address register buffer 402.

The command address register buffer 401 and the data register buffers 301 to 305 are connected by a line L71. The command address register buffer 401 and the data register buffers 306 to 309 are connected by a line L72. As described above, the command address register buffer 402 is not connected with the data register buffers 301 to 309.

In the present embodiment, the two command address register buffers 401 and 402 are used to supply the command address signal CA and the control signal CTRL to the memory chips 200 through respective different lines. The load of the lines L61 to L68 is thus reduced by half as compared to the second embodiment. This means that the load for the drivers 441, 442, 451, and 452 to drive is reduced by half. Even if the used clock signals CK and CKB have a high frequency, the command address signal CA and the control signal CTRL can thus be maintained at high signal quality.

The connections between the command address register buffers 401 and 402 and the memory chips 200 will be explained in more detail with reference to FIG. 21.

Figure 21:
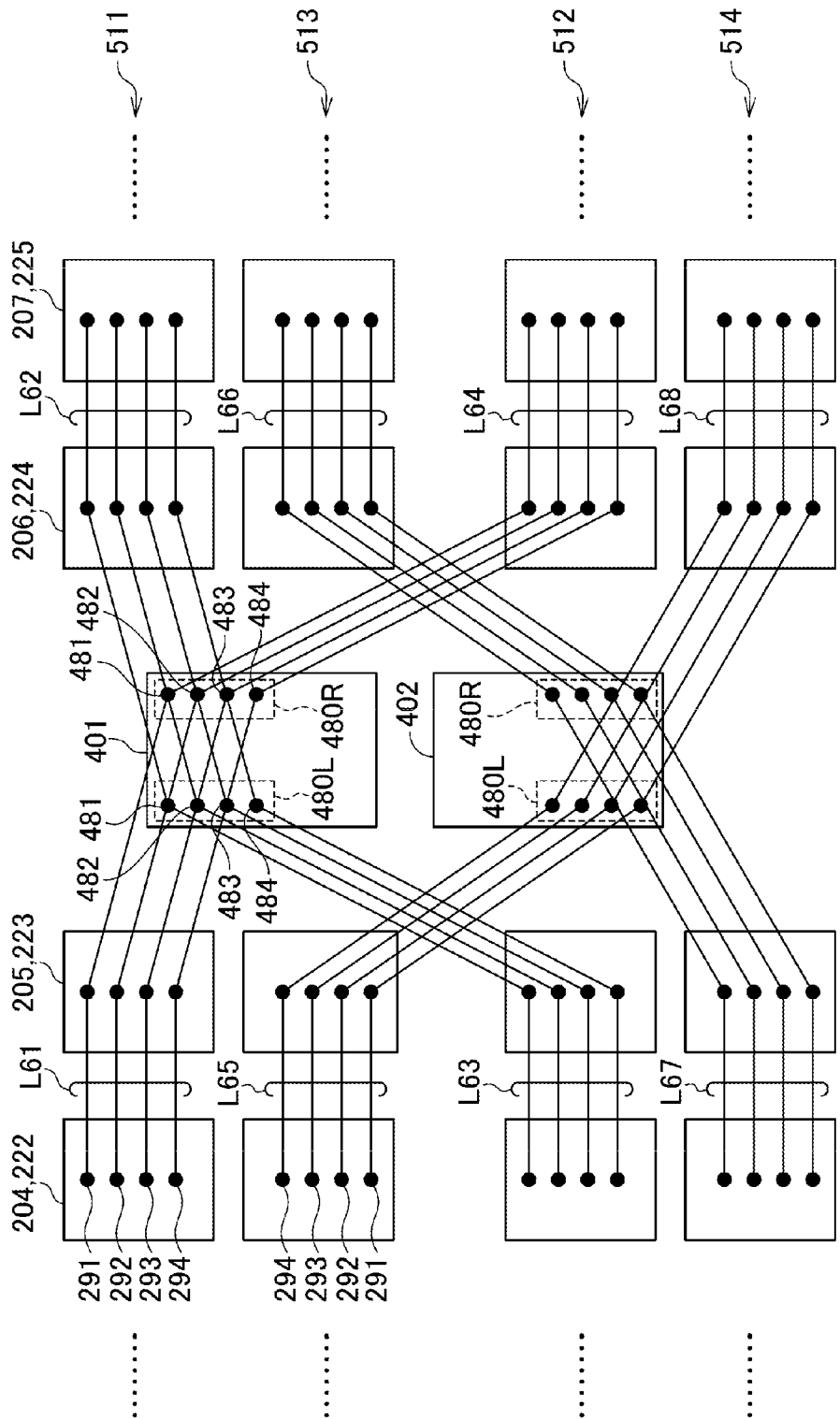
FIG. 21 is a schematic diagram for describing the connections between the command address register buffers and the memory chips according to the third preferred embodiment.

In FIG. 21, the terminals 481 to 484 formed on the command address register buffers 401 and 402 correspond to the terminals 481 to 484 shown in FIG. 9. More specifically, the terminals 481 to 484 are arranged in the Y direction. The signals output from the terminals 481 to 484 arranged in the areas 480R are the same as those output from the terminals 481 to 484 arranged in the areas 480L. The signals output from the terminals 481 to 484 are supplied to terminals 291 to 294 formed on the memory chips 200, respectively. As shown in FIG. 5, the terminals 291 to 294 are formed in the area 250CA and arranged in the Y direction.

In the present embodiment, the command address register buffer 401 is allocated to the memory chips 201 to 236 which are mounted in the same directions in the first row 511 and the second row 512. The command address register buffer 402 is allocated to the memory chips 237 to 272 which are mounted in the same directions in the third row 513 and the fourth row 514. The memory chips 201 to 236 and the memory chips 237 to 272 are mounted in 180° different directions. The command address register buffer 401 and the command address register buffer 402 are mounted in 180° different directions. As shown in FIG. 21, a plurality of lines included in each of the lines L61 to L68 (in the example shown in FIG. 21, four lines each) can be connected to the terminals 291 to 294 of the memory chips 201 to 272 without changing the arrangement order in the Y direction.

Consequently, the lines L61 to L68 can be arranged in a simple layout, with a reduction in the wiring density inside the module substrate 510. According to the present embodiment, the command address signals CA and the control signals CTRL output from the areas 480R and 480L have only to be branched into two each. The number of wiring layers needed for the branching is only two. As compared to the second embodiment, the number of wiring layers of the module substrate 510 can thus be reduced to reduce the substrate cost. Moreover, according to the present embodiment, the lines L61 to L68 have little difference in load because the same numbers of memory chips 200 are connected to the terminals 481 to 484 of the command address register buffers 401 and 402. The lines L61 to L68 can also be made the same in length.

Next, a fourth preferred embodiment of the present invention will be described.

Figure 22:
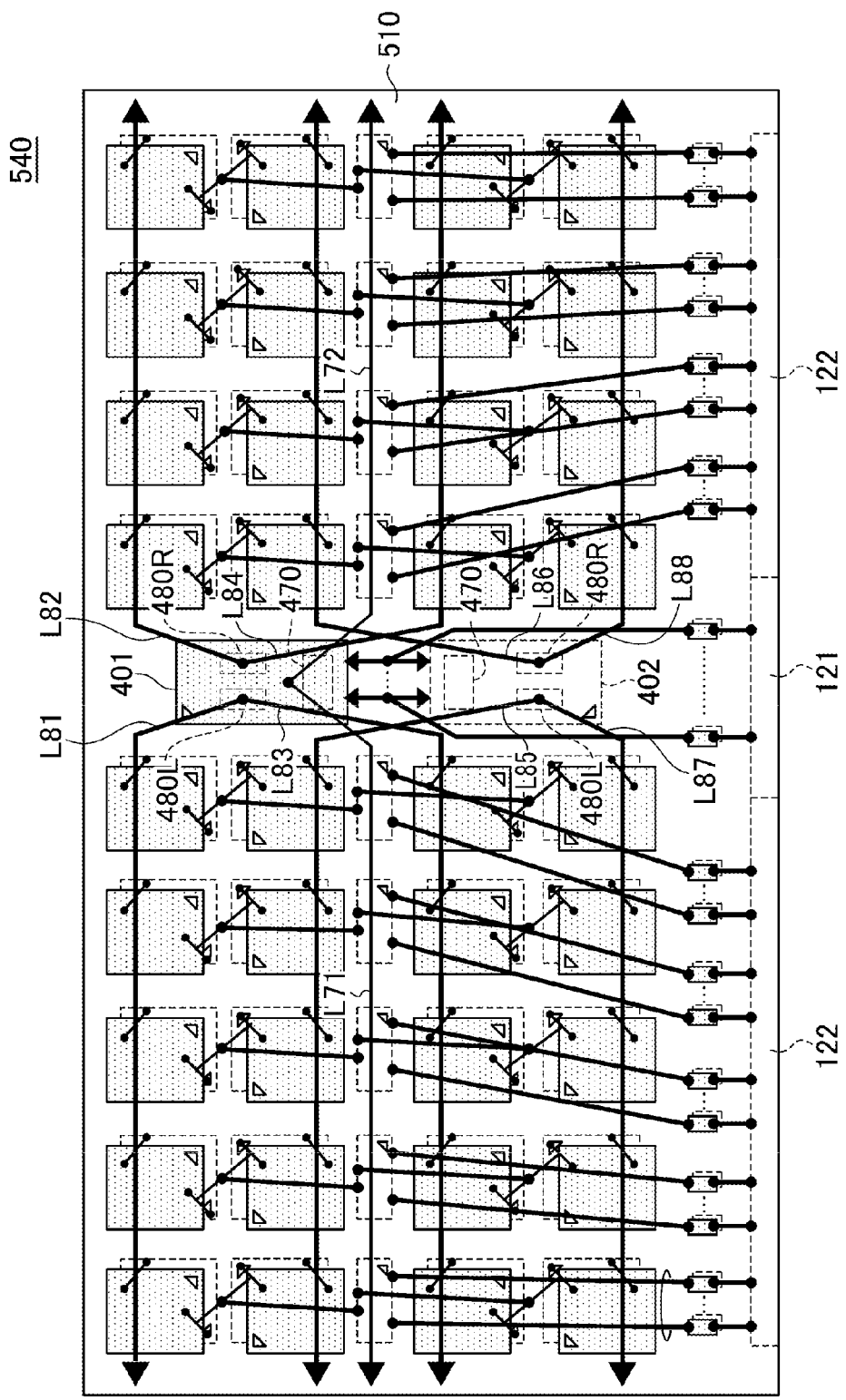
FIG. 22 is a schematic diagram showing the configuration of a memory module according to the fourth embodiment of the present invention.

As shown in FIG. 22, the memory module 540 according to the fourth embodiment of the present invention differs from the memory module 530 according to the third embodiment in the connections of the command address register buffers 401 and 402 and the memory chips 200. In other respects, the memory module 540 is the same as the memory module 530 according the third embodiment. Like parts will thus be designated by the same reference numbers. Redundant description will be omitted.

In the present embodiment, the memory chips 201 to 209 and 219 to 227 are mounted on the first row 511. The memory chips 201 to 205 and 219 to 223 arranged on the left of the command address register buffers 401 and 402 are connected in common to a line L81. The line L81 is connected to the area 480L of the command address register buffer 401. The memory chips 206 to 209 and 224 to 227 arranged on the right of the command address register buffers 401 and 402 are connected in common to a line L82. The line L82 is connected to the area 480R of the command address register buffer 401.

Of the memory chips 210 to 218 and 228 to 236 mounted on the second row 512, the memory chips 210 to 214 and 228 to 232 arranged on the left of the command address register buffers 401 and 402 are connected in common to a line L83. The line L83 is connected to the area 480L of the command address register buffer 401. The memory chips 215 to 218 and 233 to 236 arranged on the right of the command address register buffers 401 and 402 are connected in common to a line L84. The line L84 is connected to the area 480R of the command address register buffer 401.

The line L81 and the line L83 are two lines branched from the area 480L of the command address register buffer 401. The line L82 and the line L84 are two lines branched from the area 480R of the command address register buffer 401.

Of the memory chips 237 to 245 and 255 to 263 mounted on the third row 513, the memory chips 237 to 241 and 255 to 259 arranged on the left of the command address register buffers 401 and 402 are connected in common to a line L85. The line L85 is connected to the area 480L of the command address register buffer 402. The memory chips 242 to 245 and 260 to 263 arranged on the right of the command address register buffers 401 and 402 are connected in common to a line L86. The line L86 is connected to the area 480R of the command address register buffer 402.

Of the memory chips 246 to 254 and 264 to 272 mounted on the fourth row 514, the memory chips 246 to 250 and 264 to 268 arranged on the left of the command address register buffers 401 and 402 are connected in common to a line L87. The line L87 is connected to the area 480L of the command address register buffer 402. The memory chips 251 to 254 and 269 to 272 arranged on the right of the command address register buffers 401 and 402 are connected in common to a line L88. The line L88 is connected to the area 480R of the command address register buffer 402.

The line L85 and the line L87 are two lines branched from the area 480L of the command address register buffer 402. The line L86 and the line L88 are two lines branched from the area 480R of the command address register buffer 402.

With such a configuration, the present embodiment can provide almost the same effects as those of the memory module 530 according to the foregoing third embodiment. In the present embodiment, corresponding two of the lines L81 to L88 have the same load and the same wiring length. For example, the line L81 and the line L83 both are branched from the area 480L of the command address register buffer 401. The lines L81 and L83 are connected to the same numbers of memory chips 200 and have almost the same wiring lengths. According to the present embodiment, the command address signal CA and the control signal CTRL can thus be improved in signal integrity.

Figure 23A:
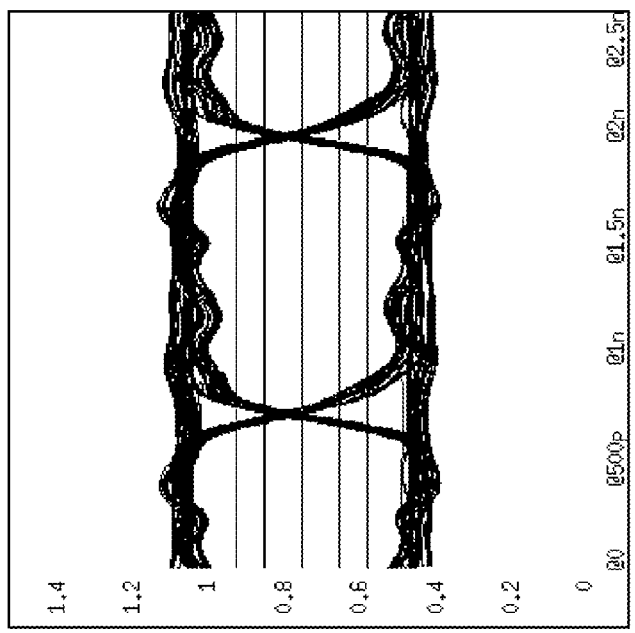
FIG. 23A shows an eye pattern of the command address signals and the control signals according to the third and fourth embodiments.
Figure 23B:
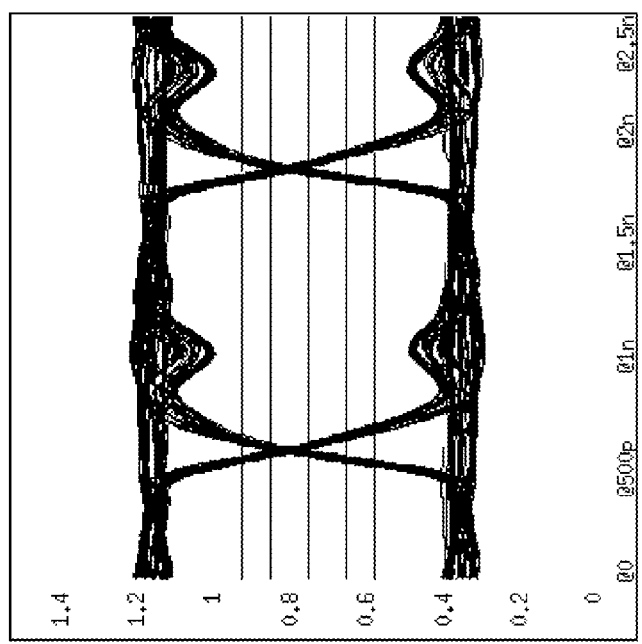
FIG. 23B shows an eye pattern of the command address signals and the control signals according to the second embodiment.

FIG. 23A shows an eye pattern of the command address signals CA and the control signals CTRL according to the third and fourth embodiments. FIG. 23B shows an eye pattern of the command address signals CA and the control signals CTRL according to the second embodiment. Both patterns show the signal waveforms on the module substrate that appeared on the memory chips 200 when the clock signals CK and CKB were set to a frequency of 400 MHz. As shown in FIGS. 23A and 23B, the third and fourth embodiments are found to provide a more favorable eye pattern than the second embodiment. The reason is considered to be that the command address signal CA and the control signal CTRL output from the command address register buffer 401 are branched into four inside the module substrate 510 according to the second embodiment, whereas the third and fourth embodiments include only branching into two.

It is apparent that the present invention is not limited to the above embodiments, but may be modified and changed without departing from the scope and spirit of the invention.

For example, in the foregoing embodiments, DRAMs are used as the memory chips 200. The present invention is not limited thereto, and other types of memory devices may be used. The memory devices to be mounted may each include a memory chip packaged in a single package. A device including two or more memory chips packaged in a single package may be used.

What is claimed is:

1. A memory module comprising:
   a module substrate having first and second main surfaces opposite to each other, the first main surface having first and second memory mounting areas, one of the first and second main surfaces having a register mounting area located between the first and second memory mounting areas in a planar view;
   a plurality of data connectors formed on the module substrate;
   a plurality of memory devices including a plurality of first memory devices that are mounted on the first memory mounting area and a plurality of second memory devices that are mounted on the second memory mounting area; and
   a plurality of data register buffers mounted on the register mounting area, the data register buffers transferring write data supplied from the data connectors to the memory devices, and transferring read data supplied from the memory devices to the data connectors, wherein
   the first memory devices are arranged in a first direction in the first memory mounting area,
   the second memory devices are arranged in the first direction in the second memory mounting area,
   the data register buffers are arranged in the first direction in the register mounting area, and
   each of the data register buffers and associated ones of the first and second memory devices connected thereto are arranged in a second direction crossing the first direction in the planar view.

2. The memory module as claimed in claim 1, wherein the first memory devices and the second memory devices are activated in common.

3. The memory module as claimed in claim 1, wherein the first memory devices and the second memory devices are mounted in 180° different directions.

4. The memory module as claimed in claim 1, wherein
   the second main surface of the module substrate has third and fourth memory mounting areas,
   the plurality of memory devices further include a plurality of third memory devices that are mounted on the third memory mounting area and a plurality of fourth memory devices that are mounted on the fourth memory mounting area,
   the first memory devices and the third memory devices are mounted in overlapping positions in the planar view,
   the second memory devices and the fourth memory devices are mounted in overlapping positions in the planar view, and
   each of data register buffers and associated ones of the third and fourth memory devices connected thereto are arranged in a second direction crossing the first direction in the planar view.

5. The memory module as claimed in claim 4, wherein
   the third memory devices and the fourth memory devices are activated in common, and
   the first and second memory devices and the third and fourth memory devices are exclusively activated.

6. The memory module as claimed in claim 4, wherein
the first memory devices and the second memory devices are mounted in 180° different directions; and
the third memory devices and the fourth memory devices are mounted in 180° different directions.

7. The memory module as claimed in claim 5, wherein
the first main surface of the module substrate further has fifth and sixth memory mounting areas,
the second main surface of the module substrate further has seventh and eighth memory mounting areas,
the plurality of memory devices further include a plurality of fifth memory devices that are mounted on the fifth memory mounting area, a plurality of sixth memory devices that are mounted on the sixth memory mounting area, a plurality of seventh memory devices that are mounted on the seventh memory mounting area, and a plurality of eighth memory devices that are mounted on the eighth memory mounting area,
the register mounting area is arranged between the fifth and sixth memory mounting areas in the planar view,
the fifth memory devices and the seventh memory devices are mounted in overlapping positions in the planar view,
the sixth memory devices and the eighth memory devices are mounted in overlapping positions in the planar view, and each of the data register buffers and associated ones of the fifth to eighth memory devices connected thereto are arranged in the second direction in the planar view.

8. The memory module as claimed in claim 7, wherein
the fifth memory devices and the sixth memory devices are activated in common,
the seventh memory devices and the eighth memory devices are activated in common,
the first and second devices, the third and fourth memory devices, the fifth and sixth memory devices, and the seventh and eighth memory devices are exclusively activated.

9. The memory module as claimed in claim 7, wherein
the fifth memory mounting area is arranged between the first memory mounting area and the register mounting area in the planar view, and
the second memory mounting area is arranged between the sixth memory mounting area and the register mounting area in the planar view.

10. The memory module as claimed in claim 7, wherein
the first memory devices and the fifth memory devices are mounted in 180° different directions,
the second memory devices and the sixth memory devices are mounted in 180° different directions,
the third memory devices and the seventh memory devices are mounted in 180° different directions, and
the fourth memory devices and the eighth memory devices are mounted in 180° different directions.

11. The memory module as claimed in claim 7, further comprising first and second command address register buffers that are mounted on the module substrate, wherein
the first command address register buffer supplies a command address signal to the first to fourth memory devices, and
the second command address register buffer supplies a command address signal to the fifth to eighth memory devices.

12. The memory module as claimed in claim 1, wherein each of the memory devices includes one or more memory chips.

13. A memory module comprising:
a module substrate having first and second main surfaces opposite to each other, the first main surface having first and second memory mounting areas, one of the first and second main surfaces having a register mounting area located between the first and second memory mounting areas in a planar view;
a plurality of data connectors formed on the module substrate;
a plurality of memory devices including a plurality of first memory devices that are mounted on the first memory mounting area and a plurality of second memory devices that are mounted on the second memory mounting area; and
a plurality of data register buffers mounted on the register mounting area, the data register buffers transferring write data supplied from the data connectors to the memory devices, and transferring read data supplied from the memory devices to the data connectors,
wherein
the second main surface of the module substrate has third and fourth memory mounting areas,
the plurality of memory devices further include a plurality of third memory devices that are mounted on the third memory mounting area and a plurality of fourth memory devices that are mounted on the fourth memory mounting area,
the first memory devices and the third memory devices are mounted in overlapping positions in the planar view,
the second memory devices and the fourth memory devices are mounted in overlapping positions in the planar view,
each of data register buffers and associated ones of the third and fourth memory devices connected thereto are arranged in a second direction crossing a first direction in the planar view,
the first main surface of the module substrate further has fifth and sixth memory mounting areas,
the second main surface of the module substrate further has seventh and eighth memory mounting areas,
the plurality of memory devices further include a plurality of fifth memory devices that are mounted on the fifth memory mounting area, a plurality of sixth memory devices that are mounted on the sixth memory mounting area, a plurality of seventh memory devices that are mounted on the seventh memory mounting area, and a plurality of eighth memory devices that are mounted on the eighth memory mounting area,
the register mounting area is arranged between the fifth and sixth memory mounting areas in the planar view,
the fifth memory devices and the seventh memory devices are mounted in overlapping positions in the planar view,
the sixth memory devices and the eighth memory devices are mounted in overlapping positions in the planar view, and
each of the data register buffers and associated ones of the fifth to eighth memory devices connected thereto are arranged in the second direction in the planar view.

14. The memory module as claimed in claim 13, wherein
the fifth memory devices and the sixth memory devices are activated in common,
the seventh memory devices and the eighth memory devices are activated in common,
the first and second devices, the third and fourth memory devices, the fifth and sixth memory devices, and the seventh and eighth memory devices are exclusively activated.

15. The memory module as claimed in claim 13, wherein
the fifth memory mounting area is arranged between the first memory mounting area and the register mounting area in the planar view, and the second memory mounting area is arranged between the sixth memory mounting area and the register mounting area in the planar view.

16. The memory module as claimed in claim 13, wherein the first memory devices and the fifth memory devices are mounted in 180° different directions, the second memory devices and the sixth memory devices are mounted in 180° different directions, the third memory devices and the seventh memory devices are mounted in 180° different directions, and the fourth memory devices and the eighth memory devices are mounted in 180° different directions.

17. The memory module as claimed in claim 13, further comprising first and second command address register buffers that are mounted on the module substrate, wherein the first command address register buffer supplies a command address signal to the first to fourth memory devices, and the second command address register buffer supplies a command address signal to the fifth to eighth memory devices.

\* \* \* \* \*